US012656397B2

(12) United States Patent
Park et al.

(10) Patent No.: US 12,656,397 B2
(45) Date of Patent: Jun. 16, 2026

(54) INTEGRATED CIRCUIT WITH MULTIPLEXER FOR TESTING

(71) Applicant: SAMSUNG ELECTRONICS CO., LTD., Suwon-si (KR)

(72) Inventors: Seaeun Park, Suwon-si (KR); Saeeun Kim, Suwon-si (KR); Thai Hoang Nguyen, Seoul-si (VN); Joon-sung Yang, Seoul-si (VN)

(73) Assignee: Samsung Electronics Co., Ltd., Suwon-si (KR)

( * ) Notice: Subject to any disclaimer, the term of this patent is extended or adjusted under 35 U.S.C. 154(b) by 104 days.

(21) Appl. No.: 18/671,560

(22) Filed: May 22, 2024

(65) Prior Publication Data

US 2025/0027992 A1    Jan. 23, 2025

(30) Foreign Application Priority Data

Jul. 20, 2023    (KR) ........................ 10-2023-0094786
Oct. 26, 2023    (KR) ........................ 10-2023-0145094

(51) Int. Cl.
    *G01R 31/3185*        (2006.01)
(52) U.S. Cl.
    CPC ................ *G01R 31/318572* (2013.01); *G01R 31/318536* (2013.01); *G01R 31/318541* (2013.01);
    (Continued)
(58) Field of Classification Search
    CPC .... G01R 31/318572; G01R 31/318536; G01R 31/318541; G01R 31/318552; G01R 31/318555; G01R 31/318586
    See application file for complete search history.

(56) References Cited

U.S. PATENT DOCUMENTS 6,385,750 B1    5/2002    Kapur et al.
6,573,742 B2    6/2003    Sim
        (Continued)

FOREIGN PATENT DOCUMENTS

JP        2003-513287        4/2003
KR    10-2001-0001059        1/2001
        (Continued)

OTHER PUBLICATIONS

Ahlawat, J. Tudu, A. Matrosova and V. Singh, "A high performance scan flip-flop design for serial and mixed mode scan test," 2016 IEEE 22nd International Symposium on On-Line Testing and Robust System Design (IOLTS), Sant Feliu de Guixols, Spain, 2016, pp. 233-238 (Year: 2016).*

*Primary Examiner* — Cynthia Britt
(74) *Attorney, Agent, or Firm* — Fish & Richardson P.C.

(57)        ABSTRACT

An integrated circuit may include a plurality of combinational logic circuits including a first combinational logic circuit, a plurality of flip-flops including a first flip-flop configured to receive a first scan input signal and a first data signal, and a first core block including a multiplexer. The multiplexer may be configured to select, based on a test control signal, one of a primary input signal received through a primary input terminal and an output signal of the first flip-flop and provide the selected signal to the first combinational logic circuit. The first flip-flop may be further configured to selectively receive, based on a scan control signal, one of the first scan input signal and the first data signal.

20 Claims, 16 Drawing Sheets

(52) U.S. Cl.

CPC ................ *G01R 31/318552* (2013.01); *G01R 31/318555* (2013.01); *G01R 31/318586* (2013.01)

(56) References Cited

U.S. PATENT DOCUMENTS

| | | | | |
|---|---|---|---|---|
| 7,376,915 B1 * | 5/2008 | Duewer | ......... | G01R 31/318536 |
| | | | | 716/119 |
| 9,297,855 B1 | 3/2016 | Jindal et al. | | |
| 10,078,114 B2 | 9/2018 | Iwata et al. | | |
| 10,598,728 B2 * | 3/2020 | Fel | ................ | G01R 31/318563 |
| 11,567,132 B2 | 1/2023 | Kang et al. | | |
| 2008/0091996 A1 * | 4/2008 | Chung | ........... | G01R 31/318544 |
| | | | | 714/727 |
| 2021/0109153 A1 | 4/2021 | Waayers et al. | | |
| 2022/0283222 A1 * | 9/2022 | Sheu | ................ | G11C 29/56004 |
| 2024/0250668 A1 * | 7/2024 | Srinivasan | ..... | G01R 31/318544 |
| 2024/0295604 A1 * | 9/2024 | Tortora | .......... | G01R 31/318541 |

FOREIGN PATENT DOCUMENTS

| | | |
|---|---|---|
| KR | 10-0381959 | 5/2003 |
| KR | 10-2022-0117825 | 8/2022 |
| KR | 10-2450484 | 9/2022 |

* cited by examiner

INTEGRATED CIRCUIT WITH MULTIPLEXER FOR TESTING

CROSS-REFERENCE TO RELATED APPLICATIONS

This application claims priority to Korean Patent Application No. 10-2023-0094786, filed in the Korean Intellectual Property Office, on Jul. 20, 2023, and Korean Patent Application No. 10-2023-0145094, filed in the Korean Intellectual Property Office, on Oct. 26, 2023, the disclosures of which are incorporated by reference herein in their entirety.

BACKGROUND

As the performance and integration degree of semiconductor integrated circuits increase, the number of flip-flops included in semiconductor integrated circuits increases. Flip-flops are used as data storage elements, and these data storage elements are used to store states. The term "flip-flop" refers to an electronic circuit that is capable of storing and maintaining 1-bit information and constitutes a basic element of a sequential logic circuit.

Design for testability (DFT) techniques are widely used to maintain the quality of semiconductor chips and improve testing efficiency. Among DFT techniques, a scan test technique is very important but has a problem in that some regions are not tested as the size of semiconductor chips increases.

SUMMARY

In general, in some aspects, the present disclosure is directed toward an integrated circuit configured to increase the test coverage of a core block and reduce the design overhead of the core block when testing a combinational logic circuit connected to a primary input terminal or a primary output terminal of the core block.

According to some aspects of the present disclosure, an integrated circuit includes a plurality of combinational logic circuits including a first combinational logic circuit, a plurality of flip-flops including a first flip-flop configured to receive a first scan input signal and a first data signal, and a first core block including a multiplexer. The multiplexer is configured to select, based on a test control signal, one of a primary input signal received through a primary input terminal and an output signal of the first flip-flop and provide the selected signal to the first combinational logic circuit. The first flip-flop is further configured to selectively receive, based on a scan control signal, one of the first scan input signal and the first data signal.

According to some aspects of the present disclosure, an integrated circuit includes a plurality of combinational logic circuits including a first combinational logic circuit configured to generate a first output signal and a second combinational logic circuit configured to generate a second output signal and output the second output signal to a primary output terminal, a plurality of flip-flops including a first flip-flop configured to receive a first scan input signal and a first data signal, and a first core block including a multiplexer. The multiplexer is configured to select, based on a test control signal, one of the first output signal received from the first combinational logic circuit and the second output signal received from the second combinational logic circuit and provide the selected signal as the first data signal to the first flip-flop. The first flip-flop is further configured to selectively receive, based on a scan control signal, one of the first scan input signal and the first data signal.

According to some aspects of the present disclosure, an integrated circuit includes a plurality of combinational logic circuits including a first combinational logic circuit and a second combinational logic circuit, a plurality of flip-flops including a first flip-flop configured to receive a first scan input signal and a first data signal, a first multiplexer configured to select, based on a first test control signal, one of a first primary input signal received through a first primary input terminal and an output signal of the first flip-flop and output the selected signal as a first selection signal, and a first core block including a second multiplexer. The second multiplexer is configured to receive the first selection signal from the first multiplexer, and select, based on a second test control signal, one of a second primary input signal received through a second primary input terminal and the first selection signal, and provide the selected signal as a second selection signal to the first combinational logic circuit. The first flip-flop is further configured to selectively receive, based on a scan control signal, one of the first scan input signal and the first data signal.

BRIEF DESCRIPTION OF THE DRAWINGS

Example implementations will become more clearly understood from the following detailed description, taken in conjunction with the accompanying drawings.

FIGS. 6A and 6B are views illustrating examples of target core blocks according to some implementations.

FIGS. 7A and 7B are views illustrating examples of integrated circuits according to some implementations.

DETAILED DESCRIPTION

Hereinafter, example implementations will be explained in detail with reference to the accompanying drawings.

Figure 1:
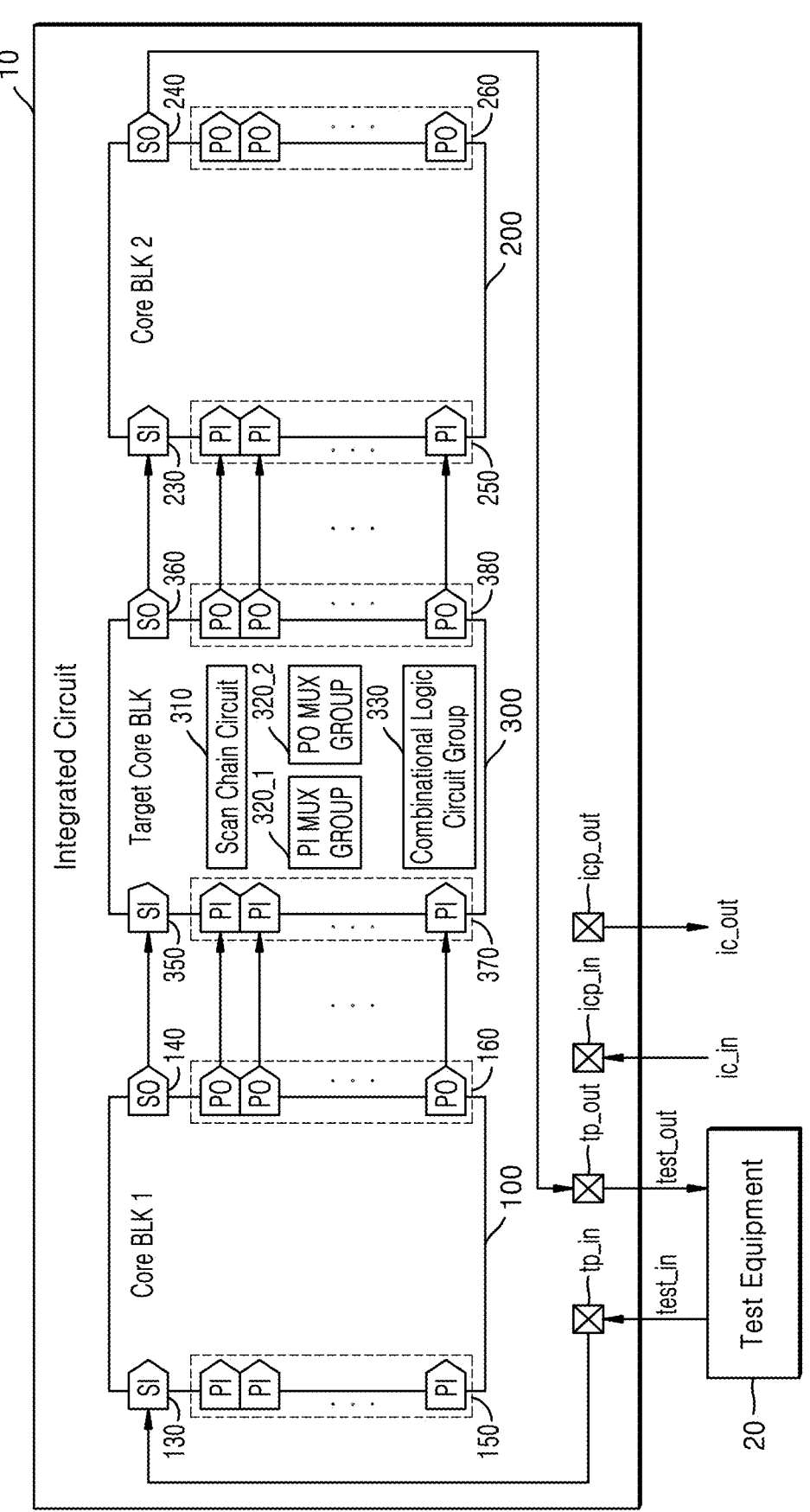
FIG. 1 is a view illustrating an examples of an integrated circuit according to some implementations.

FIG. 1 illustrates an example of an integrated circuit according to some implementations. In FIG. 1, an integrated circuit 10 may include a first core block 100, a second core block 200, and a target core block 300. Although FIG. 1 depicts the integrated circuit 10 having three core blocks (that is, the first core block 100, the second core block 200, and the target core block 300), this is only an example, and the integrated circuit 10 may include fewer or more core blocks. In some implementations, the integrated circuit 10 may be implemented as a system-on-chip (SoC) circuit.

The integrated circuit 10 may include a test input pad tp_in, a test output pad tp_out, an input pad icp_in, and an output pad icp_out. The integrated circuit 10 may receive a test input signal test_in through the test input pad tp_in. The integrated circuit 10 may output a test output signal test_out through the test output pad tp_out. The integrated circuit 10 may receive data from the outside (for example, other integrated circuits) through the input pad icp_in. The integrated circuit 10 may provide data to the outside (for example, other integrated circuits) through the output pad tp_out.

Test equipment 20 may test defects in the integrated circuit 10. For example, the test equipment 20 may test defects in the target core block 300 of the integrated circuit 10. The test equipment 20 may provide a test input signal test_in to the integrated circuit 10 through the test input pad tp_in. The integrated circuit 10 may provide a test output signal test_out, which is the result of a test on the target core block 300 with the test input signal test_in, to the test equipment 20 through the test output pad tp_out. In some implementations, the test equipment 20 may be referred to as automated test equipment (ATE).

The test input signal test_in may include a scan input signal, a scan control signal, and a test control signal. In this case, the scan control signal may be different from the test control signal.

In some implementations, the scan input signal may include test pattern data for testing core blocks included in the integrated circuit 10. The test pattern data may refer to data input to the integrated circuit 10 through the test equipment 20. The test pattern data may include a value that is arbitrarily input by a user operating the test equipment 20, or may include data previously input to the test equipment 20.

In some implementations, the scan control signal may be referred to as a scan-enable signal. For example, a scan chain circuit 310 may perform a normal operation or a scan shift operation depending on the logic level of the scan control signal.

When the scan control signal instructs a scan shift operation, the scan chain circuit 310 may sequentially output values that are output from a plurality of combinational logic circuits included in a combinational logic circuit group 330 at specific time points in synchronization with a scan shift clock. For example, when the scan control signal has a first value (for example, a logic high level), the scan control signal may instruct the scan chain circuit 310 to perform a scan shift operation. In the present disclosure, the scan shift clock may be referred to as a first clock signal.

When the scan control signal instructs a normal operation, the scan chain circuit 310 may provide stored input values to the combinational logic circuit group 330 and may store values output from the combinational logic circuits included in the combinational logic circuit group 330 in response to the input values in synchronization with a function clock. For example, when the scan control signal has a second value (for example, a logic low level), the scan control signal may instruct the scan chain circuit 310 to perform a normal operation. In this specification, the function clock may be referred to as a second clock signal. In some implementations, the normal operation may be referred to as a capture operation.

In the present disclosure, it is assumed that the first value refers to a logic high level of an arbitrary signal and the second value refers to a logic low level of an arbitrary signal. This assumption is only an example for description. In another example, the first value may refer to a logic low level and the second value may refer to a logic high level.

In some implementations, the test control signal may be referred to as a test-enable signal. The test control signal may be a signal for controlling a multiplexer connected to a primary input terminal or a primary output terminal.

In some implementations, a portion or the entirety of the test input signal test_in may be provided to a control circuit of the integrated circuit 10. The control circuit may output a signal to instruct the operations of the first core block 100, the second core block 200, and the target core block 300 of the integrated circuit 10. The control circuit may perform a test operation on the target core block 300 based on a received signal. The control circuit is further described with reference to FIGS. 7A and 7B.

The first core block 100 may receive the scan input signal through a scan input terminal 130. The first core block 100 may output a scan output signal through a scan output terminal 140. The first core block 100 may receive signals from the outside (for example, other core blocks) through a plurality of primary input terminals 150. The first core block 100 may output signals through a plurality of primary output terminals 160.

The target core block 300 may receive the scan input signal through a scan input terminal 350. The target core block 300 may output a scan output signal through a scan output terminal 360. The target core block 300 may receive signals from the outside (for example, the first core block 100) through a plurality of primary input terminals 370. The target core block 300 may output signals through a plurality of primary output terminals 380. In some embodiments, the target core block 300 may be referred to as a third core block. In present disclosure, the target core block 300 may refer to a core block to be tested using the test equipment 20.

The target core block 300 may include the scan chain circuit 310, a primary input multiplexer group 320_1, a primary output multiplexer group 320_2, and the combinational logic circuit group 330.

The scan chain circuit 310 may include a plurality of sequential logic circuits. The sequential logic circuits may each be a circuit including a memory device. The sequential logic circuits may output different pieces of output data depending on a memory state even when the same input data is input. In addition, the sequential logic circuits may be connected in series to each other. The sequential logic circuits may include a scan flip-flop. The scan flip-flop is described with reference to FIGS. 2A to 2C.

The primary input multiplexer group 320_1 may include at least one multiplexer. In an embodiment, the at least one multiplexer included in the primary input multiplexer group 320_1 may be used to control input values for combinational logic circuits connected to primary input terminals. A description thereof is provided below with reference to FIGS. 3A, 4A, and 5A.

The primary output multiplexer group 320_2 may include at least one multiplexer. In some implementations, the at least one multiplexer included in the primary output multiplexer group 320_2 may be used to observe output values for combinational logic circuits connected to primary output terminals. A description thereof is provided below with reference to FIGS. 3B, 4B, and 5B.

The combinational logic circuit group 330 may include a plurality of combinational logic circuits. The combinational logic circuits may each refer to a circuit of which the output value is determined depending on the current input value regardless of the previous input value. That is, the combinational logic circuits may output the same output data for the same input data.

The second core block 200 may receive the scan input signal through a scan input terminal 230. The second core block 200 may output a scan output signal through a scan output terminal 240. The second core block 200 may receive signals from the outside (for example, the target core block 300) through a plurality of primary input terminals 250. The second core block 200 may output signals through a plurality of primary output terminals 260.

The second core block 200 may include a combinational logic circuit group and a scan chain circuit. The second core block 200 may be configured similar to the first core block 100.

In some implementations, test pattern data included in the test input signal test_in received from the test equipment 20 may be provided to the first core block 100. The first core block 100 may provide the received test pattern data to the target core block 300.

In some implementations, the test output signal test_out may include test result data obtained by testing the target core block 300. The test result data obtained by testing the target core block 300 according to the test pattern data may be provided to the test equipment 20 through the second core block 200.

A combinational logic circuit region that is directly and electrically connected to a primary input terminal has no flip-flop between the combinational logic circuit region and the primary input terminal, a combinational logic circuit region that is directly and electrically connected to a primary output terminal has no flip-flop between the combinational logic circuit region and the primary output terminal. Accordingly, the combinational logic circuit regions may not be controlled or observed using a scan chain, and it may be impossible to test the combinational logic circuit regions by a scan test method. Such regions that are impossible to test by a scan test method may not be included in the test coverage of the scan testing. Accordingly, in general, a test point insertion (TPI) method or a core wrapping method may be used to test such untestable regions. However, these methods require the addition of a plurality of new flip-flops, causing an increase in the area of a core block and an increase in the design overhead of an integrated circuit including the core block.

However, according to some implementations, the target core block 300 includes a multiplexer for connecting a primary input terminal and a combinational logic circuit to each other, and thus, flip-flops included in the scan chain circuit 310 may be reused. That is, according to some implementations, combinational logic circuits connected to primary input terminals may be tested using only a multiplexer occupying a smaller area than a flip-flop without adding a new flip-flop to the target core block 300. For example, depending on the number of multiplexers added to the target core block 300, only one primary input terminal may be connected to one flip-flop through a multiplexer, or a plurality of primary input terminals may be connected to one flip-flop through multiplexers. A description thereof is provided below with reference to FIGS. 3A, 4A, and 5A.

In addition, according to some implementations, the target core block 300 includes a multiplexer that is inserted for connecting a primary output terminal and a combinational logic circuit to each other, and flip-flops included in the scan chain circuit 310 may be reused. For example, according to some implementations, combinational logic circuits connected to primary output terminals may be tested using only a multiplexer occupying a smaller area than a flip-flop without adding a new flip-flop to the target core block 300. Accordingly, depending on the number of multiplexers added to the target core block 300, only one primary output terminal may be connected to one flip-flop through a multiplexer, or a plurality of primary output terminals may be connected to one flip-flop through multiplexers. A description thereof is provided below with reference to FIGS. 3B, 4B, and 5B.

Figure 2A:
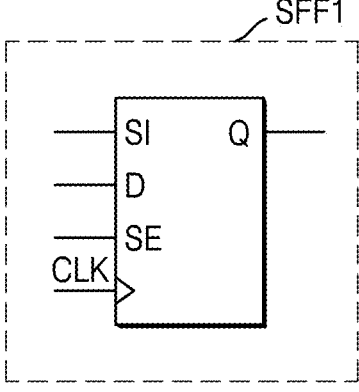
FIGS. 2A to 2C are views illustrating sequential logic circuits included in an example of a scan chain circuit according to some implementations.
Figure 2B:
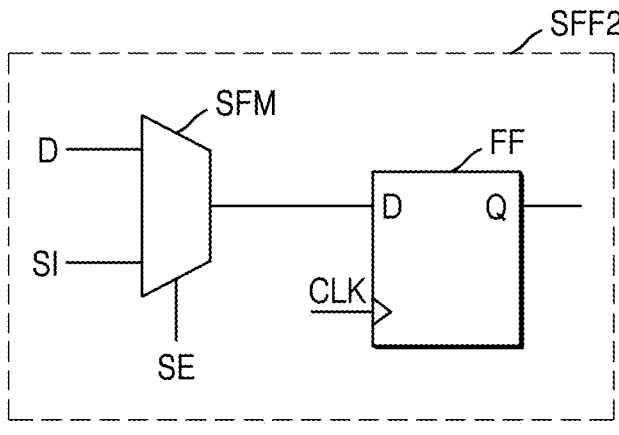
Figure 2C:
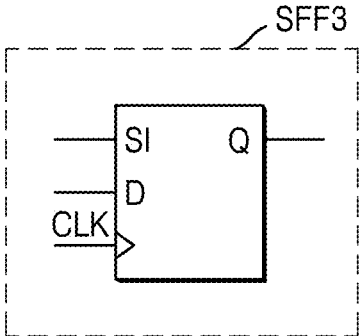

FIGS. 2A to 2C are views illustrating sequential logic circuits included in an example of a scan chain circuit according to some implementations. FIGS. 2A to 2C may be described with reference to FIG. 1, and repeated descriptions thereof may be omitted.

FIGS. 2A to 2C illustrate a first scan flip-flop SFF1, a second scan flip-flop SFF2, and a third scan flip-flop SFF3. In FIG. 2A, the first scan flip-flop SFF1 may receive a data signal D, a scan input signal SI, or a scan control signal SE and may output an output signal Q according to a clock signal CLK. The scan control signal SE input to the first scan flip-flop SFF1 may be provided from a control circuit included in the integrated circuit 10 or from the test equipment 20.

The scan control signal SE may instruct a normal operation or a scan shift operation depending on the logic level of the scan control signal SE. When the scan control signal SE instructs a normal operation, the first scan flip-flop SFF1 may perform the normal operation by storing the data signal D and providing a stored value as the output signal Q. When the scan control signal SE instructs a scan shift operation, the first scan flip-flop SFF1 may perform the scan shift operation by storing the scan input signal SI and providing a stored value as the output signal Q.

In FIG. 2 the second scan flip-flop SFF2 is an implementation of the first scan flip-flop SFF1 and corresponds to a detailed illustration of the first scan flip-flop SFF1. The second scan flip-flop SFF2 may include a multiplexer SFM and a flip-flop FF. The multiplexer SFM may output the data signal D or the scan input signal SI to the flip-flop FF depending on the logic level of the scan control signal SE. For example, when the scan control signal SE instructs a normal operation, the data signal D may be output to the flip-flop FF. In addition, when the scan control signal SE instructs a scan shift operation, the scan input signal SI may be output to the flip-flop FF. The second scan flip-flop SFF2 may store an output value of the multiplexer SFM according to the clock signal CLK and may output a stored value as the output signal Q.

In FIG. 2 the third scan flip-flop SFF3 is an implementation of the first scan flip-flop SFF1 and corresponds to a simple illustration of the first scan flip-flop SFF1. Accordingly, the third scan flip-flop SFF3 may operate in the same manner as the first scan flip-flop SFF1, and the scan control signal SE may be omitted. Although the scan control signal SE is omitted, the third scan flip-flop SFF3 receives the scan control signal SE from the outside and may perform a normal operation or a scan shift operation depending on the logic level of the scan control signal SE.

In the present disclosure, the first scan flip-flop SFF1, the second scan flip-flop SFF2, and the third scan flip-flop SFF3 may all refer to the same scan flip-flop, and the flip-flop may be a scan flip-flop. Hereinafter, flip-flops are simply illustrated in the form of the third scan flip-flop SFF3 according to some implementations.

Figure 3A:
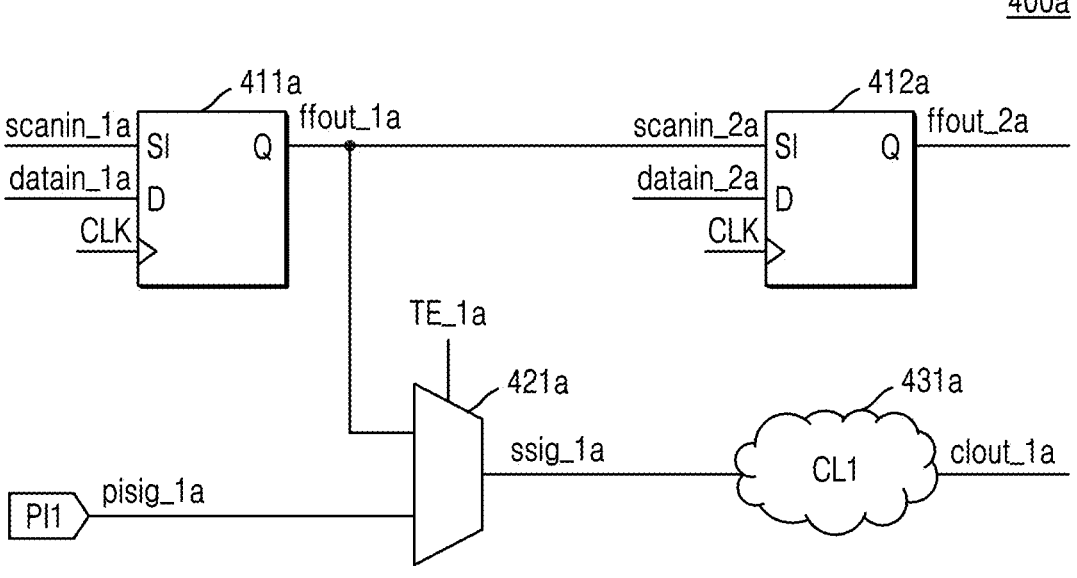
FIGS. 3A and 3B are views illustrating examples of portions of target core blocks according to some implementations.
Figure 3B:
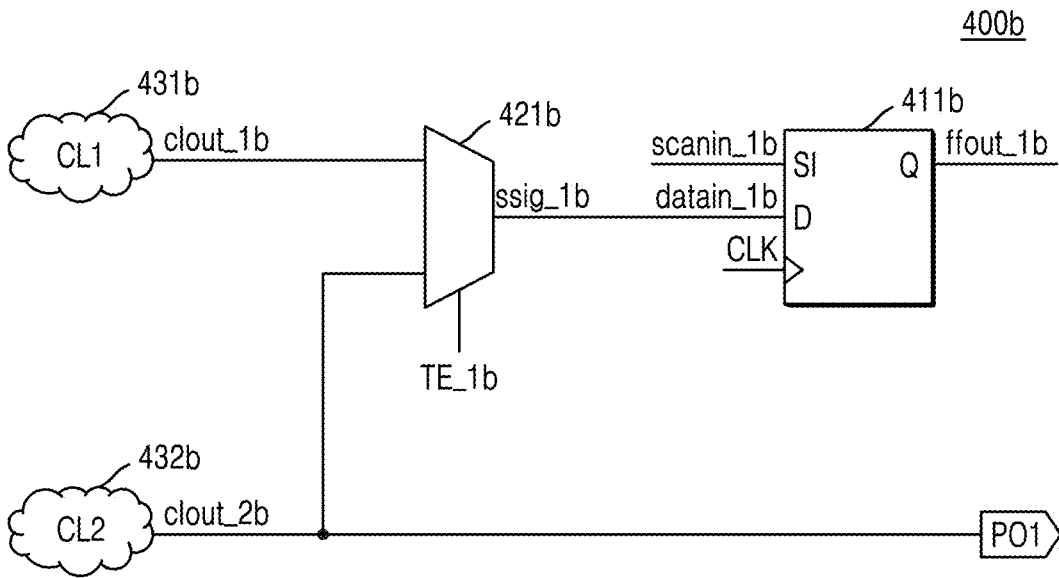

FIGS. 3A and 3B illustrate examples of portions of target core blocks according to some implementations. In, FIG. 3A is a view illustrating an example of an operation of testing a combinational logic circuit connected to one primary input terminal by reusing one flip-flop. FIG. 3B is a view illustrating an examples of an operation of testing a combinational logic circuit connected to one primary output terminal by reusing one flip-flop. FIGS. 3A and 3B may be described with reference to FIGS. 1 to 2C, and repeated descriptions thereof may be omitted.

The target core block 400a shown in FIG. 3A may be similar to the target core block 300 described with reference to FIG. 1. The target core block 400a may include a first primary input terminal PI1, a first flip-flop 411a, a second flip-flop 412a, a first multiplexer 421a, and a first combinational logic circuit 431a.

In some implementations, the first flip-flop 411a and the second flip-flop 412a may be included in the flip-flops of the scan chain circuit 310 described with reference to FIG. 1.

In some implementations, the first combinational logic circuit 431a may be included in the combinational logic circuit group 330 described with reference to FIG. 1.

In some implementations, the first multiplexer 421a may be included in the primary input multiplexer group 320_1 described with reference to FIG. 1.

The first flip-flop 411a may receive a first scan input signal scanin_1a and a first data signal datain_1a. The first flip-flop 411a may operate according to a clock signal CLK and output a stored value (for example, a received value) as a first output signal ffout_1a. The first output signal ffout_1a may be provided to the second flip-flop 412a and the first multiplexer 421a.

In some implementations, the first scan input signal scanin_1a may be received from the scan input terminal 350 (refer to FIG. 1). In some implementations, the first scan input signal scanin_1a may be received from another flip-flop included in the target core block 400a.

In some implementations, the first data signal datain_1a may be received from one of a plurality of combinational logic circuits included in the target core block 400a. For example, the first data signal datain_1a may be received from the first combinational logic circuit 431a.

The second flip-flop 412a may receive a second scan input signal scanin_2a and a second data signal datain_2a. The second flip-flop 412a may operate according to the clock signal CLK and output a stored value (for example, a received value) as a second output signal ffout_2a. The first flip-flop 411a and the second flip-flop 412a may be connected in series to each other.

In some implementations, the first output signal ffout_1a output from the first flip-flop 411a may be provided to the second flip-flop 412a as the second scan input signal scanin_2a. In this case, the first output signal ffout_1a and the second scan input signal scanin_2a may have the same value.

In some implementation, the second data signal datain_2a may be received from one of the combinational logic circuits included in the target core block 400a.

The first multiplexer 421a may receive a first primary input signal pisig_1a from the first primary input terminal PI1 and the first output signal ffout_1a from the first flip-flop 411a. The first multiplexer 421a may select, based on a first test control signal TE_1a, one of the first primary input signal pisig_1a and the first output signal ffout_1a. The first multiplexer 421a may output the selected signal as a first selection signal ssig_1a. The first multiplexer 421a may provide the first selection signal ssig_1a to the first combinational logic circuit 431a. In an embodiment, when the first test control signal TE_1a has a first value, the first multiplexer 421a may select the first output signal ffout_1a. In an embodiment, when the first test control signal TE_1a has a second value, the first multiplexer 421a may select the first primary input signal pisig_1a.

In some implementations, the first primary input signal pisig_1a may be received from a core block different from the target core block 400a, such as the first core block 100 described with reference to FIG. 1.

The first combinational logic circuit 431a may receive the first selection signal ssig_1a as an input signal and may thus output an output signal clout_1a according to the first selection signal ssig_1a.

When the first multiplexer 421a is not included in the target core block 400a, the first primary input terminal PI1 is directly connected to the first combinational logic circuit 431a. In this case, it may be impossible to control an input value to the first combinational logic circuit 431a through a scan test. However, according to FIG. 3A, the first combinational logic circuit 431a may receive a value from the first flip-flop 411a through the first multiplexer 421a. For example, external test equipment, such as the test equipment 20 described with reference to FIG. 1, may provide an input value to the first combinational logic circuit 431a through the first multiplexer 421a, and thus, a scan test operation may be performed on the first combinational logic circuit 431a. In addition, according to FIG. 3A, the first flip-flop 411a included in an existing scan chain may be reused through the first multiplexer 421a instead of adding a new flip-flop, thereby minimizing an increase in the area of the target core block 400a.

The target core block 400b shown in FIG. 3B may be similar to the target core block 300 described with reference to FIG. 1. The target core block 400b may include a first primary output terminal PO1, a first flip-flop 411b, a first multiplexer 421b, a first combinational logic circuit 431b, and a second combinational logic circuit 432b.

In some implementations, the first flip-flop 411b may be included in the flip-flops of the scan chain circuit 310 described with reference to FIG. 1.

In some implementations, the first combinational logic circuit 431b and the second combinational logic circuit 432b may be included in the combinational logic circuit group 330 described with reference to FIG. 1.

In some implementations, the first multiplexer 421b may be included in the primary output multiplexer group 320_2 described with reference to FIG. 1.

The first flip-flop 411b may receive a first scan input signal scanin_1b and a first data signal datain_1b. The first flip-flop 411b may operate according to a clock signal CLK and output a stored value (for example, a received value) as a first output signal ffout_1b.

In some implementations, the first scan input signal scanin_1b may be received from another flip-flop included in the target core block 400b.

In some implementations, the first data signal datain_1b may be received from the first multiplexer 421b.

In some implementations, the first output signal ffout_1b may be provided to another flip-flop included in the target core block 400b. In addition, the first output signal ffout_1b may be provided to another core block (for example, the second core block 200 (refer to FIG. 1) through a scan output terminal (refer to the scan output terminal 360 shown in FIG. 1) of the target core block 400b. In addition, the first output signal ffout_1b may be provided to a control circuit through the scan output terminal (refer to the scan output terminal 360 shown in FIG. 1) of the target core block 400b, and an implementations thereof is described below with reference to FIG. 7B.

The first multiplexer 421*b* may receive a first combinational logic output signal clout_1*b* from the first combinational logic circuit 431*b*, and a second combinational logic output signal clout_2*b* from the second combinational logic circuit 432*b*. The first multiplexer 421*b* may select, based on a first test control signal TE_1*b*, one of the first combinational logic output signal clout_1*b* and the second combinational logic output signal clout_2*b*. The first multiplexer 421*b* may output the selected signal as a first selection signal ssig_1*b*. The first multiplexer 421*b* may provide the first selection signal ssig_1*b* to the first flip-flop 411*b*.

In some implementations, the first multiplexer 421*b* may provide the first selection signal ssig_1*b* as the first data signal datain_1*b* to the first flip-flop 411*b*. Accordingly, the first selection signal ssig_1*b* and the first data signal datain_1*b* may have the same value.

In some implementations, when the first test control signal TE_1*b* has a first value, the first multiplexer 421*b* may select the first combinational logic output signal clout_1*b*. In some implementations, when the first test control signal TE_1*b* has a second value, the first multiplexer 421*b* may select the second combinational logic output signal clout_2*b*.

The second combinational logic circuit 432*b* may provide the second combinational logic output signal clout_2*b* to the first multiplexer 421*b*. In addition, the second combinational logic circuit 432*b* may provide the second combinational logic output signal clout_2*b* to the first primary output terminal PO1.

In some implementations, when the second combinational logic circuit 432*b* provides the second combinational logic output signal clout_2*b* to the first primary output terminal PO1, the second combinational logic output signal clout_2*b* may be provided to a core block (for example, the second core block 200 described with reference to FIG. 1) different from the target core block 400*b*.

When the first multiplexer 421*b* is not included in the target core block 400*b*, the first primary output terminal PO1 may be directly connected to the second combinational logic circuit 432*b*. Accordingly, it may be impossible to observe an output value of the second combinational logic circuit 432*b* through a scan test. However, according to the implementations shown in FIG. 3B, the output value of the second combinational logic circuit 432*b* may be provided to the first flip-flop 411*b* through the first multiplexer 421*b*. For example, external test equipment, such as the test equipment 20 shown in FIG. 1, may determine, by observing a value stored in the first flip-flop 411*b*, whether the output value of the second combinational logic circuit 432*b* is defective. For example, a scan test operation may be performed on the second combinational logic circuit 432*b*. In addition, according to the implementation shown in FIG. 3B, the first flip-flop 411*b* included in an existing scan chain may be reused through the first multiplexer 421*b* instead of adding a new flip-flop, thereby minimizing an increase in the area of the target core block 400*b*.

Figure 4A:
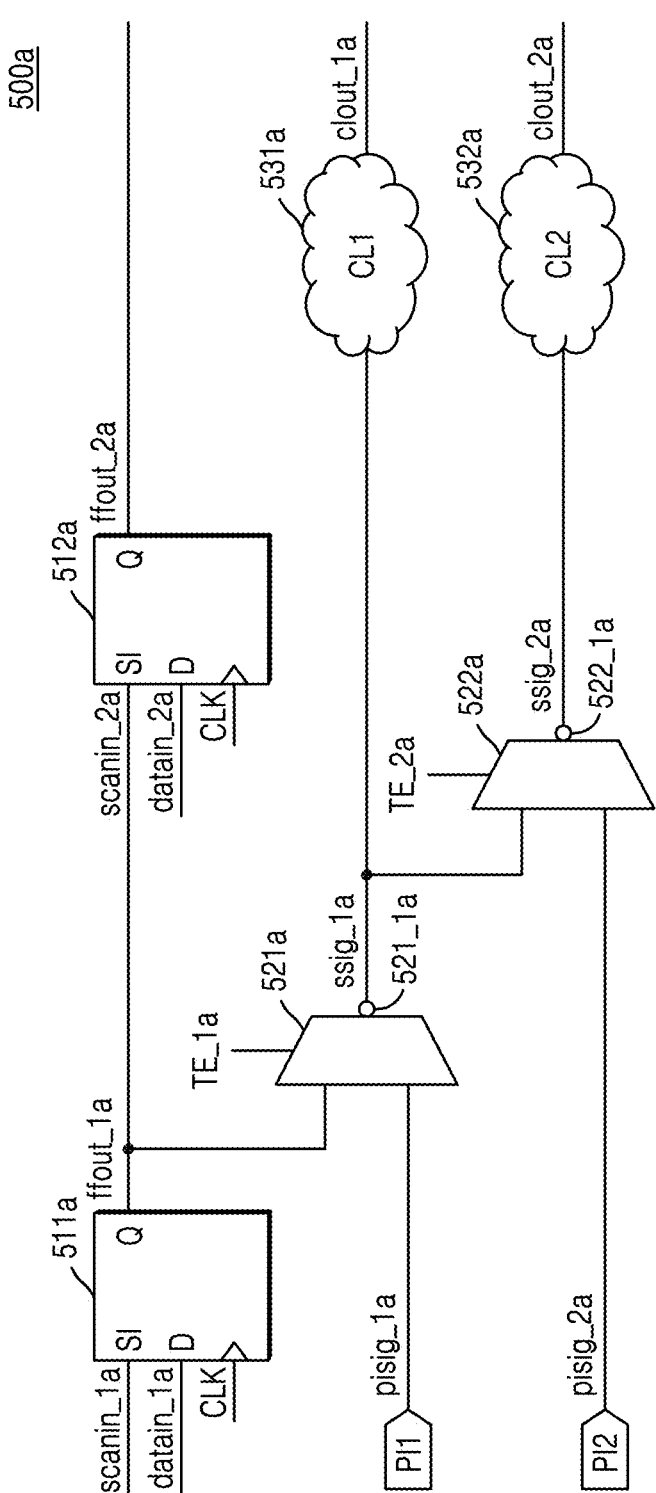
FIGS. 4A and 4B are views illustrating examples of portions of target core blocks according to some implementations.
Figure 4B:
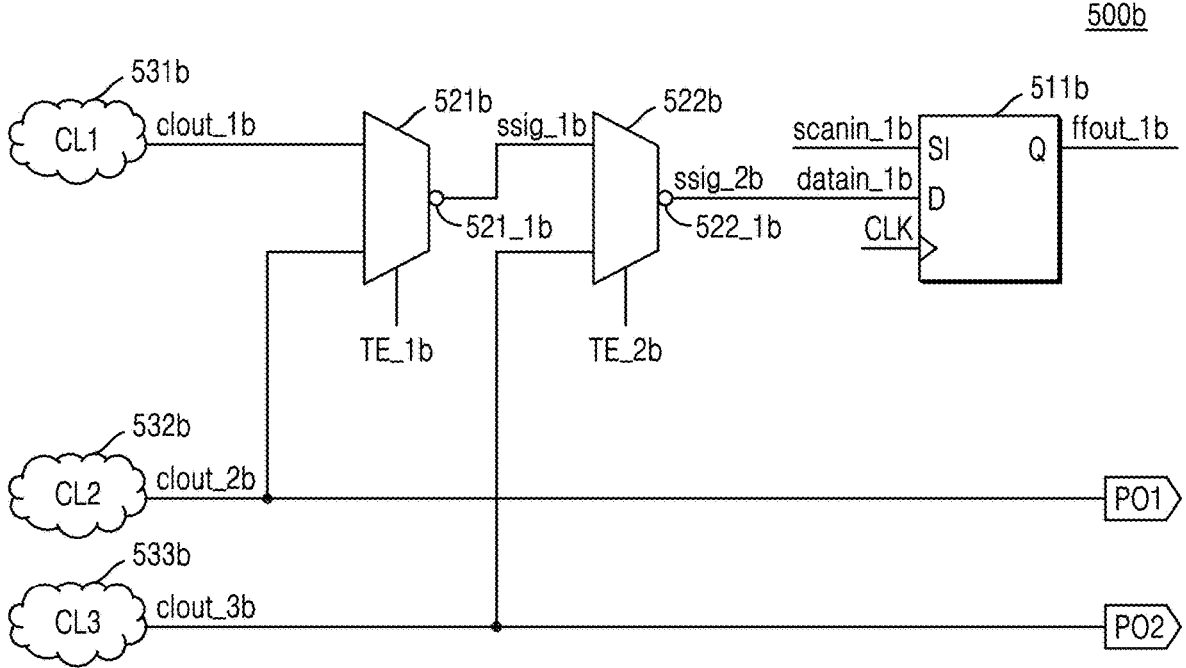

FIGS. 4A and 4B illustrate examples of portions of target core blocks according to some implementations. For example, FIG. 4A is a view illustrating how to perform a test on a combinational logic circuit connected to two primary input terminals by reusing one flip-flop. FIG. 4B is a view illustrating how to perform a test on a combinational logic circuit connected to two primary output terminals by reusing one flip-flop. FIGS. 4A and 4B may be described with reference to FIGS. 3A and 3B, and repeated descriptions thereof may be omitted.

The target core block 500*a* shown in FIG. 4A may be similar to the target core block 400*a* described with reference to FIG. 3A. However, the target core block 500*a* shown in FIG. 4A further includes a second primary input terminal PI2, a second multiplexer 522*a*, and a second combinational logic circuit 532*a*. The target core block 500*a* is described focusing on the difference between the target core block 500*a* shown in FIG. 4A and the target core block 400*a* shown in 3A.

In some implementations, the second combinational logic circuit 532*a* may be included in the combinational logic circuit group 330 described with reference to FIG. 1.

In some implementations, the second multiplexer 522*a* may be included in the primary input multiplexer group 320_1 described with reference to FIG. 1.

The target core block 500*a* may include a first primary input terminal PI1, the second primary input terminal PI2, a first flip-flop 511*a*, a second flip-flop 512*a*, a first multiplexer 521*a*, the second multiplexer 522*a*, a first combinational logic circuit 531*a*, and the second combinational logic circuit 532*a*.

The first multiplexer 521*a* may receive a first output signal ffout_1*a* from the first flip-flop 511*a*. The first multiplexer 521*a* may receive a first primary input signal pisig_1*a* from the first primary input terminal PI1. The first multiplexer 521*a* may select, based on a first test control signal TE_1*a*, one of the first output signal ffout_1*a* and the first primary input signal pisig_1*a*. The first multiplexer 521*a* may output the selected signal as a first selection signal ssig_1*a*, and the first selection signal ssig_1*a* may be provided to the second multiplexer 522*a* and the first combinational logic circuit 531*a*. The first combinational logic circuit 531*a* may perform an operation based on the received first selection signal ssig_1*a* and output a first combinational logic output signal clout_1*a*.

In some implementations, the first multiplexer 521*a* may include a first inverter 521_1*a*. The first inverter 521_1*a* may invert a signal selected by the first multiplexer 521*a*. That is, the first multiplexer 521*a* may invert one signal selected from the first output signal ffout_1*a* and the first primary input signal pisig_1*a* and may output the inverted signal as the first selection signal ssig_1*a*.

The second multiplexer 522*a* may receive the first selection signal ssig_1*a* from the first multiplexer 521*a*. The second multiplexer 522*a* may receive a second primary input signal pisig_2*a* from the second primary input terminal PI2. The second multiplexer 522*a* may select, based on a second test control signal TE_2*a*, one of the first selection signal ssig_1*a* and the second primary input signal pisig_2*a*. The second multiplexer 522*a* may output the selected signal as a second selection signal ssig_2*a* and provide the second selection signal ssig_2*a* to the second combinational logic circuit 532*a*. The second combinational logic circuit 532*a* may perform an operation based on the received second selection signal ssig_2*a* and output a second combinational logic output signal clout_2*a*.

In some implementations, the second multiplexer 522*a* may include a second inverter 522_1*a*. The second inverter 522_1*a* may invert a signal selected by the second multiplexer 522*a*. For example, the second multiplexer 522*a* may invert one signal selected from the first selection signal ssig_1*a* and the second primary input signal pisig_2*a* and output the inverted signal as the second selection signal ssig_2*a*.

According to the implementation shown in FIG. 4A, the first flip-flop 511*a* included in an existing scan chain may be reused through the first multiplexer 521*a* and the second multiplexer 522a instead of adding a new flip-flop, further minimizing an increase in the area of the target core block 500a compared to the case described with reference to FIG. 3A.

The target core block 500b shown in FIG. 4B may be similar to the target core block 400b described with reference to FIG. 3B. However, the target core block 500b shown in FIG. 4B further includes a second primary output terminal PO2, a second multiplexer 522b, and a third combinational logic circuit 533b. The target core block 500b is described focusing on the difference between the target core block 500b shown in FIG. 4B and the target core block 400b shown in FIG. 3B.

In some implementations, the third combinational logic circuit 533b may be included in the combinational logic circuit group 330 described with reference to FIG. 1.

In some implementations, the second multiplexer 522b may be included in the primary output multiplexer group 320_2 described with reference to FIG. 1.

The target core block 500b may include a first primary output terminal PO1, the second primary output terminal PO2, a first flip-flop 511b, a first multiplexer 521b, the second multiplexer 522b, a first combinational logic circuit 531b, a second combinational logic circuit 532b, and the third combinational logic circuit 533b.

The third combinational logic circuit 533b may provide a third combinational logic output signal clout_3b to the second multiplexer 522b and the second primary output terminal PO2.

The first multiplexer 521b may receive a first combinational logic output signal clout_1b from the first combinational logic circuit 531b. The first multiplexer 521b may receive a second combinational logic output signal clout_2b from the second combinational logic circuit 532b. The first multiplexer 521b may select, based on a first test control signal TE_1b, one of the first combinational logic output signal clout_1b and the second combinational logic output signal clout_2b. The first multiplexer 521b may output the selected signal as a first selection signal ssig_1b and provide the first selection signal ssig_1b to the second multiplexer 522b.

In some implementations, the first multiplexer 521b may include a first inverter 521_1b. The first inverter 521_1b may invert a signal selected by the first multiplexer 521b. That is, the first multiplexer 521b may invert one signal selected from the first combinational logic output signal clout_1b and the second combinational logic output signal clout_2b and may output the inverted signal as the first selection signal ssig_1b.

The second multiplexer 522b may receive the first selection signal ssig_1b from the first multiplexer 521b. The second multiplexer 522b may receive the third combinational logic output signal clout_3b from the third combinational logic circuit 533b. The second multiplexer 522b may select, based on a second test control signal TE_2b, one of the first selection signal ssig_1b and the third combinational logic output signal clout_3b. The second multiplexer 522b may output the selected signal as a second selection signal ssig_2b and provide the second selection signal ssig_2b to the first flip-flop 511b.

In some implementations, the second multiplexer 522b may include a second inverter 522_1b. The second inverter 522_1b may invert a signal selected by the second multiplexer 522b. That is, the second multiplexer 522b may invert one signal selected from the first selection signal ssig_1b and the third combinational logic output signal clout_3b and may output the inverted signal as the second selection signal ssig_2b.

According to the implementations shown in FIG. 4B, the first flip-flop 511b included in an existing scan chain may be reused through the first multiplexer 521b and the second multiplexer 522b instead of adding a new flip-flop, further minimizing an increase in the area of the target core block 500b compared to the case described with reference to FIG. 3B.

Figure 5A:
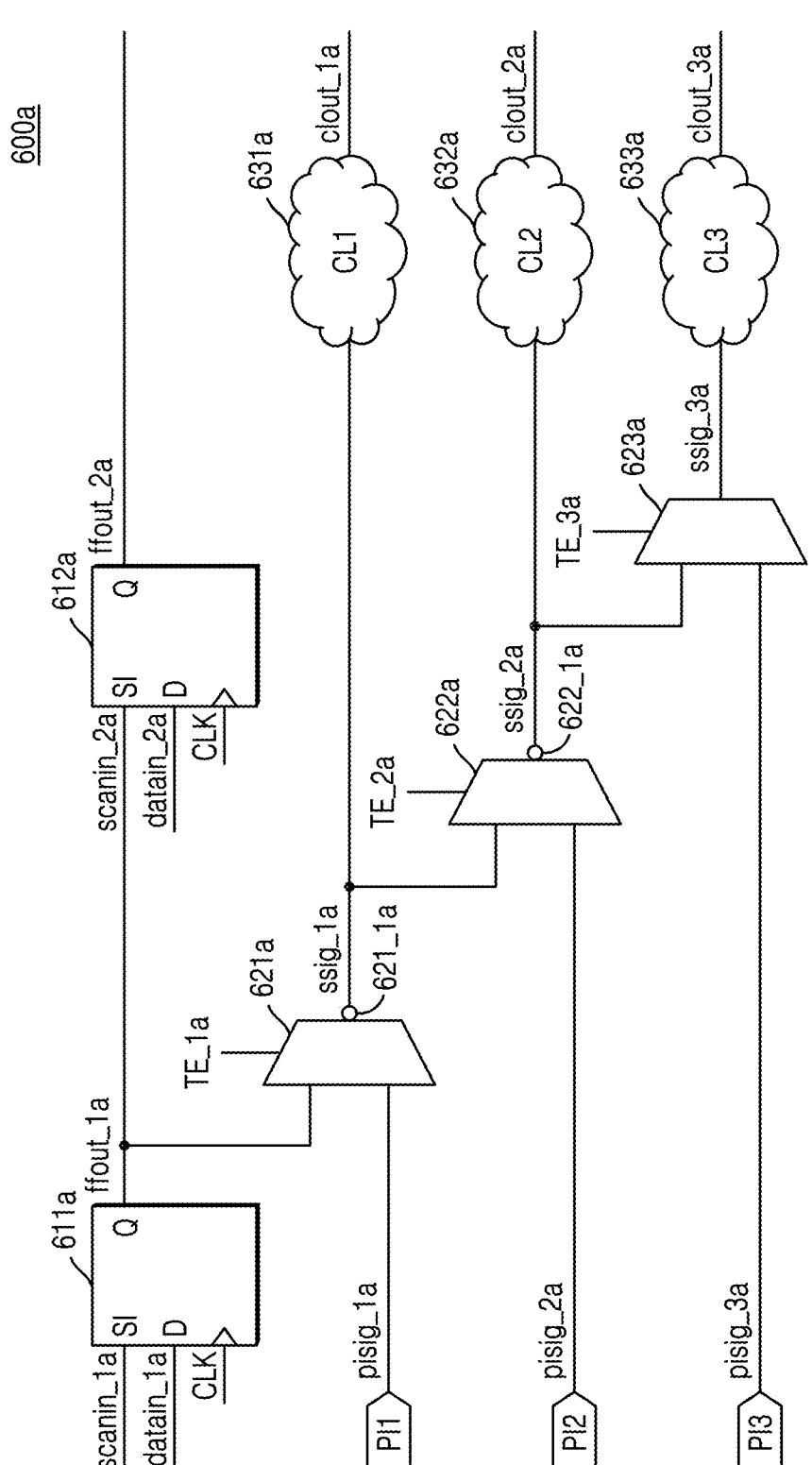
FIGS. 5A and 5B are views illustrating examples of portions of target core blocks according to some implementations.
Figure 5B:
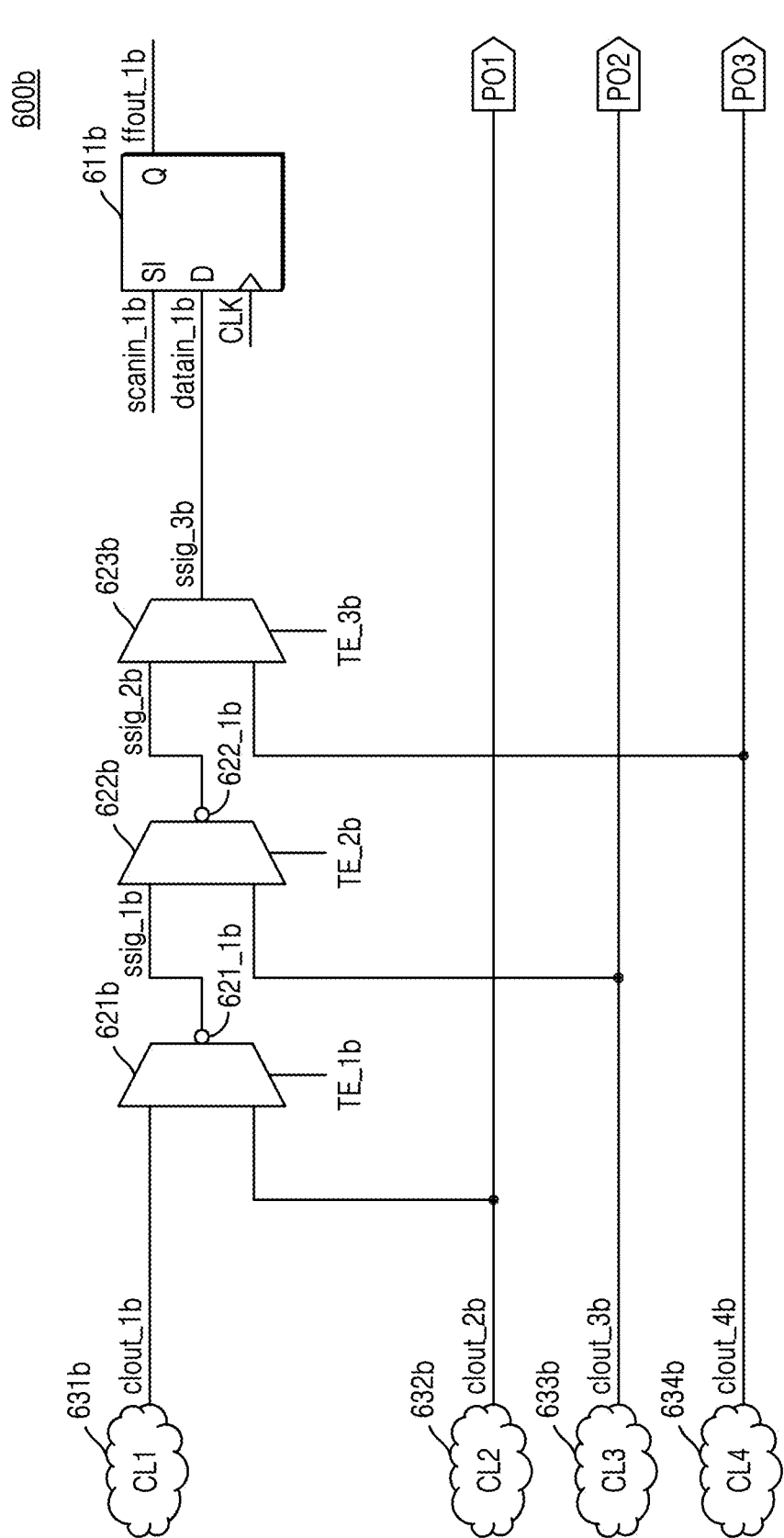

FIGS. 5A and 5B illustrate examples of portions of target core blocks according to some implementations. For example, FIG. 5A is a view illustrating how to perform a test on a combinational logic circuit connected to three primary input terminals by reusing one flip-flop. FIG. 5B is a view illustrating how to perform a test on a combinational logic circuit connected to three primary output terminals by reusing one flip-flop. FIGS. 5A and 5B may be described with reference to FIGS. 3A to 4B, and repeated descriptions thereof may be omitted.

The target core block 600a shown in FIG. 5A may be similar to the target core block 500a described with reference to FIG. 4A. However, the target core block 600a shown in FIG. 5A further includes a third primary input terminal PI3, a third multiplexer 623a, and a third combinational logic circuit 633a. The target core block 600a is described focusing on the difference between the target core block 600a shown in FIG. 5A and the target core block 500a shown in FIG. 4A.

In some implementations, the third combinational logic circuit 633a may be included in the combinational logic circuit group 330 described with reference to FIG. 1.

In some implementations, the third multiplexer 623a may be included in the primary input multiplexer group 320_1 described with reference to FIG. 1.

The target core block 600a may include a first primary input terminal PI1, a second primary input terminal PI2, the third primary input terminal PI3, a first flip-flop 611a, a second flip-flop 612a, a first multiplexer 621a, a second multiplexer 622a, the third multiplexer 623a, a first combinational logic circuit 631a, a second combinational logic circuit 632a, and the third combinational logic circuit 633a.

The third multiplexer 623a may receive a second selection signal ssig_2a from the second multiplexer 622a. The third multiplexer 623a may receive a third primary input signal pisig_3a from the third primary input terminal PI3. The third multiplexer 623a may select, based on a third test control signal TE_3a, one of the second selection signal ssig_2a and the third primary input signal pisig_3a. The third multiplexer 623a may output the selected signal as a third selection signal ssig_3a and provide the third selection signal ssig_3a to the third combinational logic circuit 633a. The third combinational logic circuit 633a may perform an operation based on the received third selection signal ssig_3a and output a third combinational logic output signal clout_3a.

According to the implementations shown in FIG. 5A, the first flip-flop 611a included in an existing scan chain may be reused through the first multiplexer 621a, the second multiplexer 622a, and the third multiplexer 623a instead of adding a new flip-flop may be reused, further minimizing an increase in the area of the target core block 600a compared to the case described with reference to FIG. 4A.

The target core block 600b shown in FIG. 5B may be similar to the target core block 500b described with reference to FIG. 4B. However, the target core block 600b in FIG. 5B further includes a third primary output terminal PO3, a third multiplexer 623b, and a fourth combinational logic circuit 634b. The target core block 600b is described focusing on the difference between the target core block 600b shown in FIG. 5B and the target core block 500b shown in FIG. 4B.

In some implementations, the fourth combinational logic circuit 634b may be included in the combinational logic circuit group 330 described with reference to FIG. 1.

In some implementations, the third multiplexer 623b may be included in the primary output multiplexer group 320_2 described with reference to FIG. 1.

The target core block 600b may include a first primary output terminal PO1, a second primary output terminal PO2, the third primary output terminal PO3, a first flip-flop 611b, a first multiplexer 621b, a second multiplexer 622b, the third multiplexer 623b, a first combinational logic circuit 631b, a second combinational logic circuit 632b, a third combinational logic circuit 633b, and the fourth combinational logic circuit 634b.

The fourth combinational logic circuit 634b may provide a fourth combinational logic output signal clout_4b to the third multiplexer 623b and the third primary output terminal PO3.

The third multiplexer 623b may receive a second selection signal ssig_2b from the second multiplexer 622b. The third multiplexer 623b may receive the fourth combinational logic output signal clout_4b from the fourth combinational logic circuit 634b. The third multiplexer 623b may select, based on a third test control signal TE_3b, one of the second selection signal ssig_2b and the fourth combinational logic output signal clout_4b. The third multiplexer 623b may output the selected signal as a third selection signal ssig_3b and provide the third selection signal ssig_3b to the first flip-flop 611b.

According to the implementation shown in FIG. 5B, the first flip-flop 611b included in an existing scan chain may be reused through the first multiplexer 621b, the second multiplexer 622b and the third multiplexer 623b instead of adding a new flip-flop, further minimizing an increase in the area of the target core block 600b compared to the case described with reference to FIG. 4B.

Figure 6A:
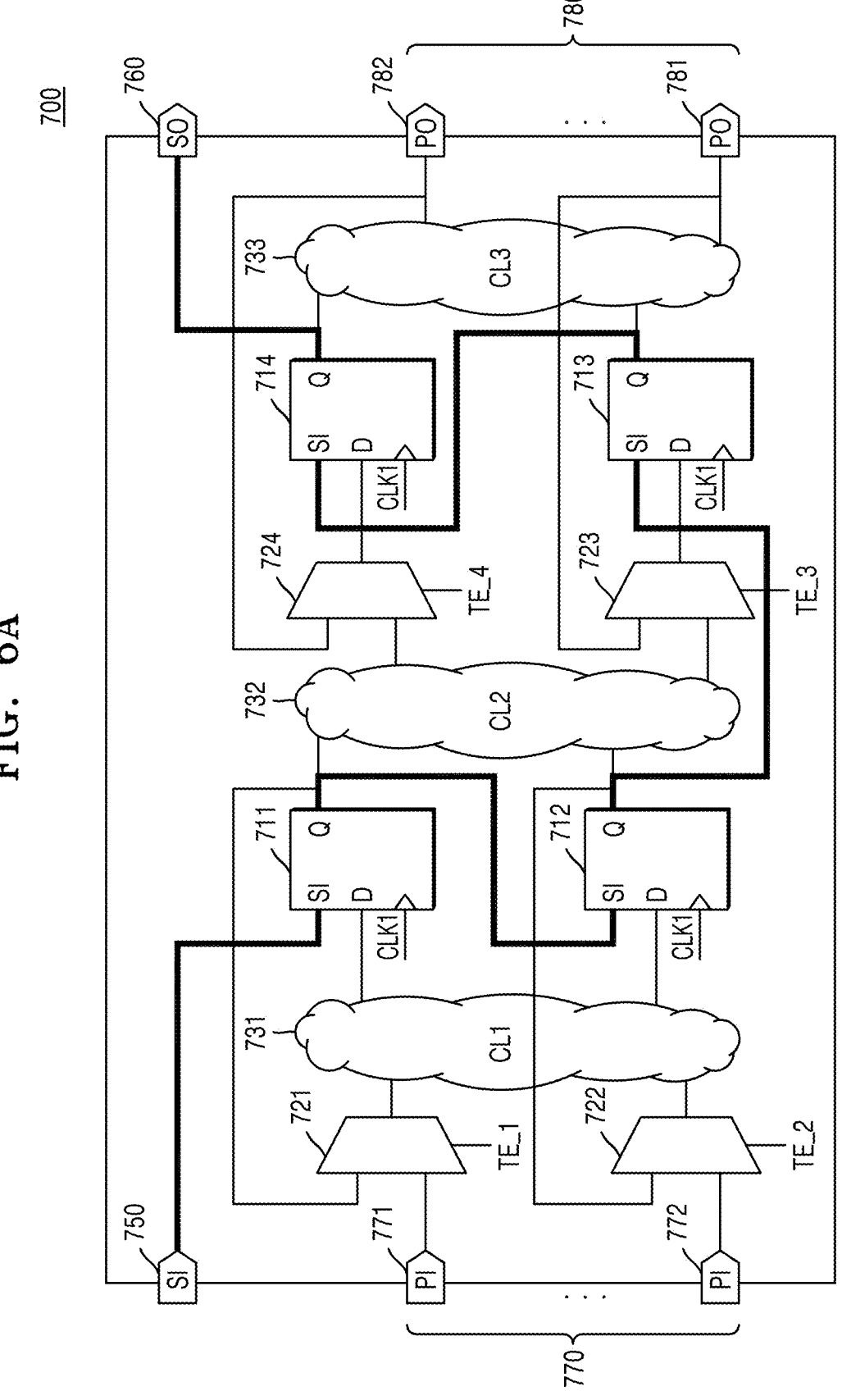
Figure 6B:
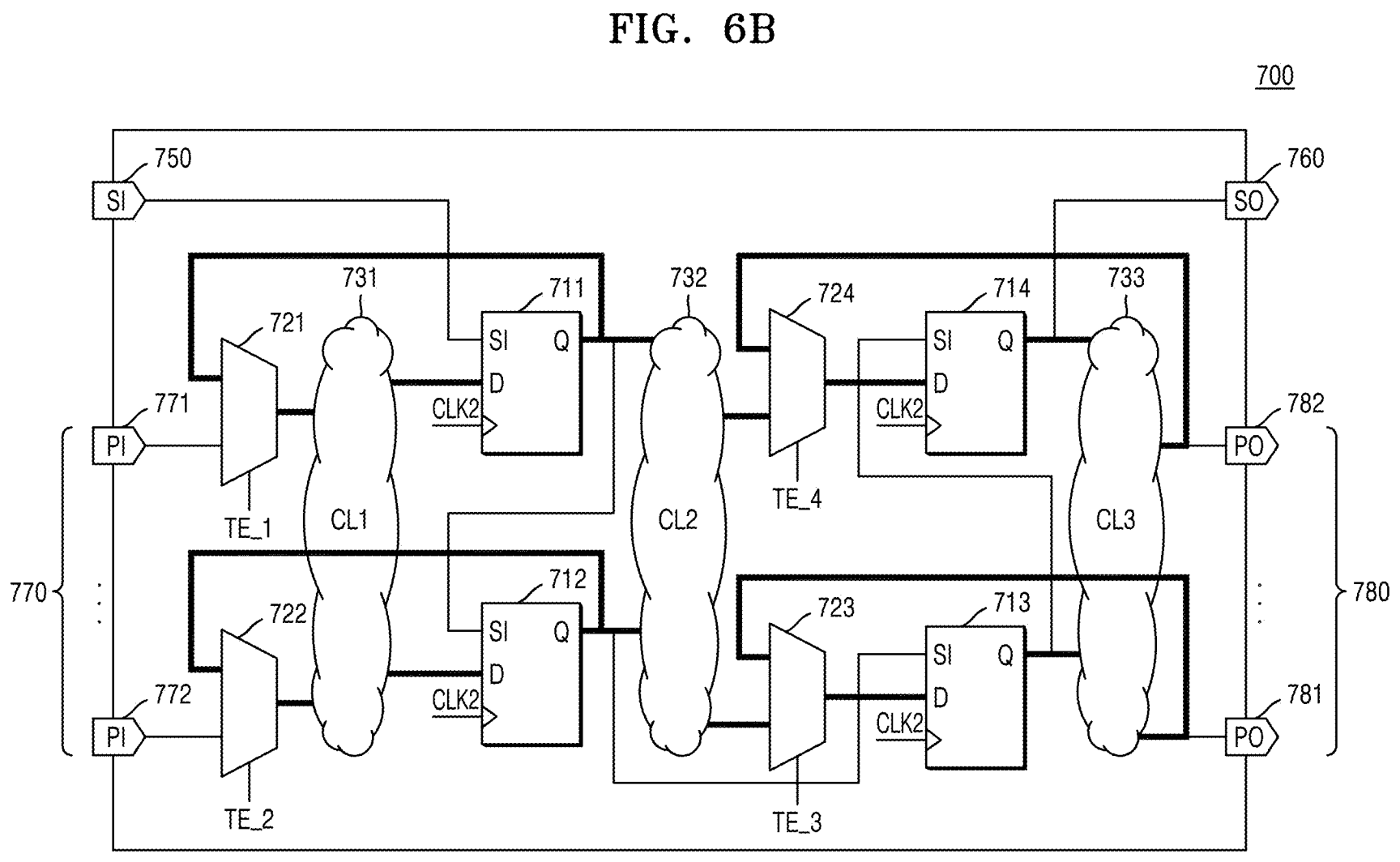

FIGS. 6A and 6B illustrate an example of a target core block according to some implementations. For example, FIG. 6A is a view illustrating a scan shift operation of the target core block 700, and FIG. 6B is a view illustrating a capture operation of the target core block 700. FIGS. 6A and 6B may be described with reference to FIGS. 1 to 5B, and repeated descriptions thereof may be omitted.

In FIGS. 6A and 6B, the target core block 700 may correspond to the target core block 300 described with reference to FIG. 1. The target core block 700 may include first to fourth flip-flops 711 to 714, first to fourth multiplexers 721 to 724, first to third combinational logic circuits 731 to 733, a scan input terminal 750, a scan output terminal 760, a plurality of primary input terminals 770, and a plurality of primary output terminals 780. The primary input terminals 770 may include a first primary input terminal 771 and a second primary input terminal 772. The primary output terminals 780 may include a first primary output terminal 781 and a second primary output terminal 782.

The first to fourth flip-flops 711 to 714 may form a scan chain. That is, the first to fourth flip-flops 711 to 714 may be included in the scan chain circuit 310 described with reference to FIG. 1.

The first multiplexer 721 may select, based on a first test control signal TE_1, one of a signal received from the first primary input terminal 771 and a signal received from the first flip-flop 711 and may provide the selected signal to the first combinational logic circuit 731.

The second multiplexer 722 may select, based on a second test control signal TE_2, one of a signal received from the second primary input terminal 772 and a signal received from the second flip-flop 712 and may provide the selected signal to the first combinational logic circuit 731.

In some implementations, the first multiplexer 721 and the second multiplexer 722 may be included in the primary input multiplexer group 320_1 described with reference to FIG. 1.

The third multiplexer 723 may select, based on the third test control signal TE_3, one of a signal received from the third combinational logic circuit 733 and a signal received from the second combinational logic circuit 732 and may provide the selected signal to the third flip-flop 713.

The fourth multiplexer 724 may select, based on a fourth test control signal TE_4, one of a signal received from the third combinational logic circuit 733 and a signal received from the second combinational logic circuit 732 and may provide the selected signal to the fourth flip-flop 714.

In some implementations, the third multiplexer 723 and the fourth multiplexer 724 may be included in the primary output multiplexer group 320_2 described with reference to FIG. 1.

The scan shift operation of the target core block 700 will now be described with reference to FIG. 6A. In FIG. 6A, when the target core block 700 performs the scan shift operation, data input to the target core block 700 or data output from the target core block 700 may flow along a path indicated by bold lines in FIG. 6A. For example, when the target core block 700 performs the scan shift operation, test pattern data received through the scan input terminal 750 may be input to the first to fourth flip-flops 711 to 714. In addition, data, such as test result data, stored in the first to fourth flip-flops 711 to 714 may be output through the scan output terminal 760.

In some implementations, when the target core block 700 performs the scan shift operation, a scan control signal provided to the target core block 700 may have a first value.

In some implementations, the scan shift operation of the target core block 700 may be performed in response to a scan control signal received from a control circuit and having a first value. The scan shift operation of the target core block 700 may be performed according to a scan shift clock CLK1 received from the control circuit.

The capture operation of the target core block 700 will now be described with reference to FIG. 6B. In FIG. 6B, the target core block 700 may perform the capture operation on the first to third combinational logic circuits 731 to 733 based on test pattern data input as described with reference to FIG. 6A.

In some implementations, when the target core block 700 performs the capture operation, the scan control signal provided to the target core block 700 may have a second value.

In some implementations, when the target core block 700 performs the capture operation, data may flow in the target core block 700 along a path indicated by bold lines in FIG. 6B. For example, when the target core block 700 performs the capture operation, the test pattern data stored in the first to fourth flip-flops 711 to 714 may be input to the first to third combinational logic circuits 731 to 733, and the first to third combinational logic circuits 731 to 733 may generate output values based on input values and may provide the output values to the first to fourth flip-flops 711 to 714.

In some implementations, when the first test control signal TE_1 has the first value, the first multiplexer 721 may select a signal received from the first flip-flop 711 storing at least a portion of the test pattern data and may provide a value corresponding to the received signal to the first combinational logic circuit 731. The first combinational logic circuit 731 may provide a result value corresponding to the value received from the first multiplexer 721 to the first flip-flop 711. A user operating the test equipment 20 may determine whether the value provided to the first flip-flop 711 from the first combinational logic circuit 731 matches test result data according to the test pattern data and may determine, based on the determination, whether the first combinational logic circuit 731 is defective.

In some implementations, when the second test control signal TE_2 has the first value, the second multiplexer 722 may select a signal received from the second flip-flop 712 storing at least a portion of the test pattern data and may provide a value corresponding to the received signal to the first combinational logic circuit 731. The first combinational logic circuit 731 may provide a result value corresponding to the value received from the second multiplexer 722 to the second flip-flop 712. A user operating the test equipment 20 may determine whether the value provided to the second flip-flop 712 from the first combinational logic circuit 731 matches test result data according to the test pattern data and may determine, based on the determination, whether the first combinational logic circuit 731 is defective.

In some implementations, when the third test control signal TE_3 has the first value, the third multiplexer 723 may select a signal received from the third combinational logic circuit 733 and may provide a value corresponding to the received signal to the third flip-flop 713. A user operating the test equipment 20 may determine whether the value provided to the third flip-flop 713 from the third multiplexer 723 matches test result data according to the test pattern data and may determine, based on the determination, whether the third combinational logic circuit 733 is defective.

In some implementations, when the fourth test control signal TE_4 has the first value, the fourth multiplexer 724 may select a signal received from the third combinational logic circuit 733 and may provide a value corresponding to the received signal to the fourth flip-flop 714. A user operating the test equipment 20 may determine whether the value provided to the fourth flip-flop 714 from the fourth multiplexer 724 matches test result data according to the test pattern data and may determine, based on the determination, whether the fourth combinational logic circuit 734 is defective.

In some implementations, the capture operation of the target core block 700 may be performed in response to the scan control signal received from the control circuit and having the second value. The capture operation of the target core block 700 may be performed according to a function clock CLK2 received from the control circuit.

In some implementations, the frequency of the function clock CLK2 may be different from the frequency of the scan shift clock CLK1. For example, the frequency of the function clock CLK2 may be higher than the frequency of the scan shift clock CLK1. When the test pattern data is stored in the first to fourth flip-flops 711 to 714, the test pattern data may be stored in a form different from the intension of a user operating the test equipment 20 because of a high clock frequency such as the frequency of the function clock CLK2. Accordingly, for storing the test pattern data in the first to fourth flip-flops 711 to 714, the scan shift clock CLK1 applied to the target core block 700 during a scan shift operation may have a lower frequency than the function clock CLK2 applied to the target core block 700 during a normal operation of the target core block 700.

Figure 7A:
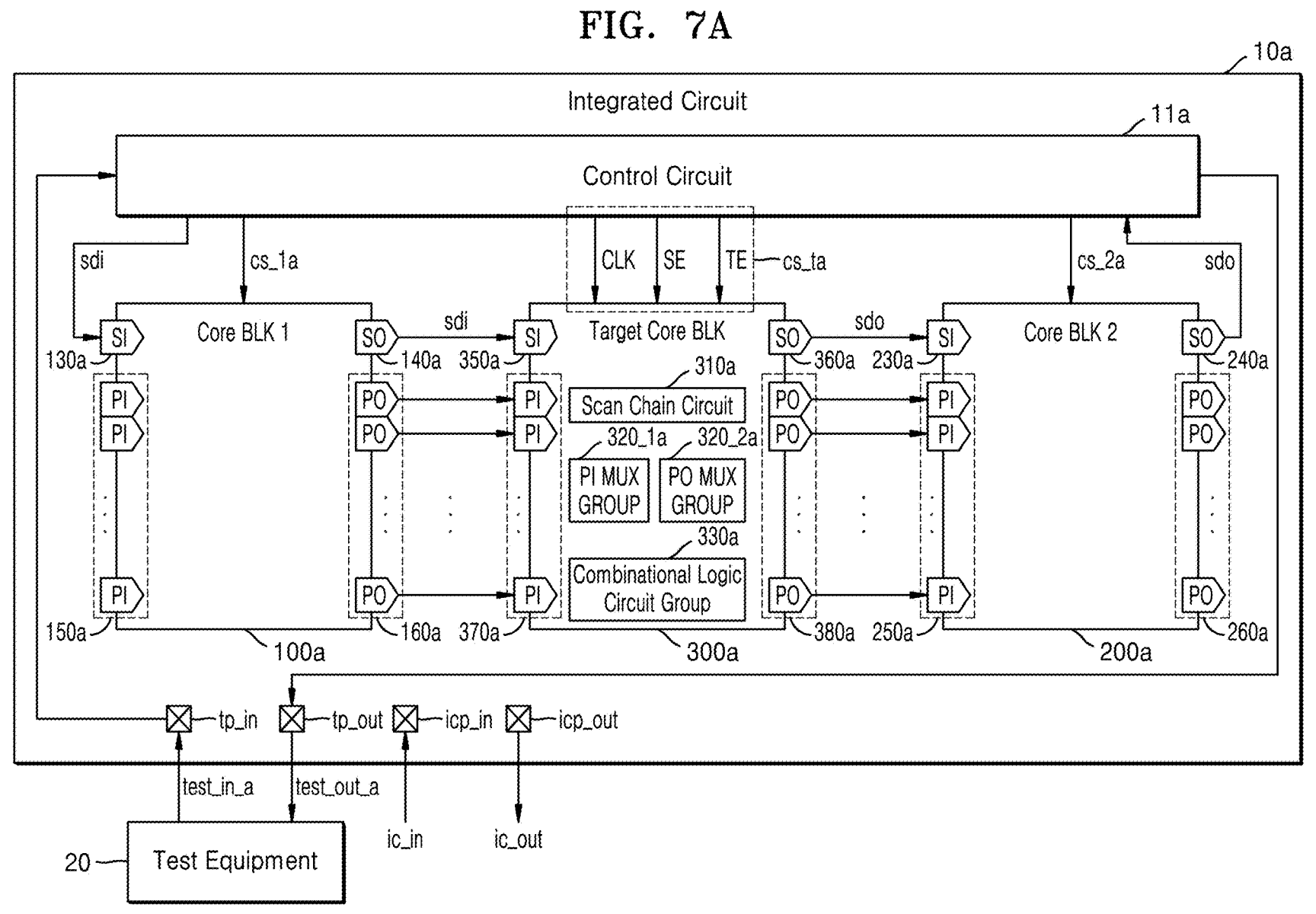
Figure 7B:
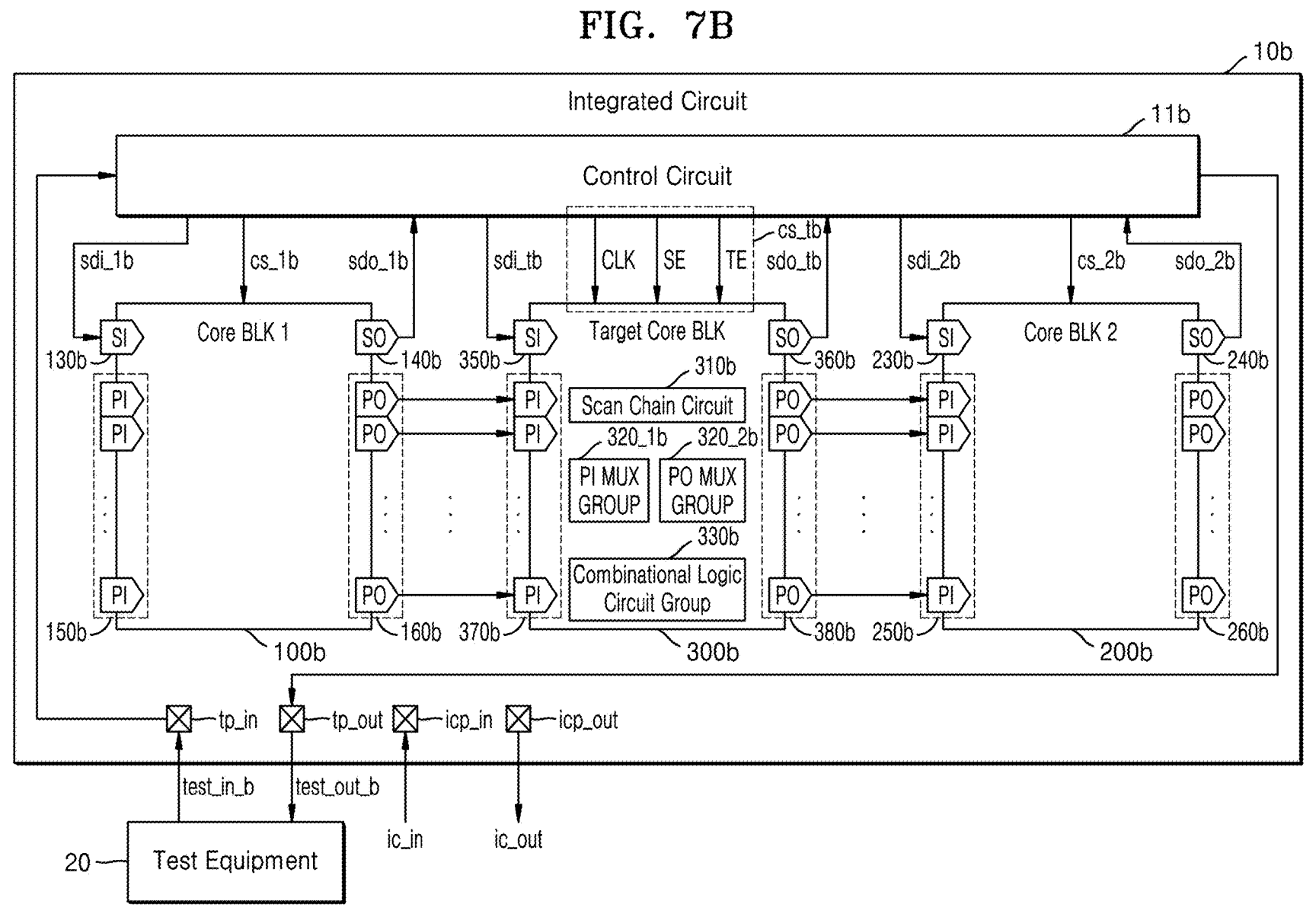

FIGS. 7A and 7B illustrate examples of integrated circuits according to some implementations. For example, FIG. 7A illustrates that a control circuit 11a is additionally added to the integrated circuit 10 described with reference to FIG. 1. Unlike FIG. 7A, FIG. 7B shows an implementation in which a scan input terminal and a scan output terminal of each core block are connected to a control circuit 11b. FIGS. 7A and 7B may be described with reference to FIG. 1, and repeated descriptions thereof may be omitted.

The integrated circuit 10a described with reference to FIG. 7A may correspond to the integrated circuit 10 described with reference to FIG. 1. The integrated circuit 10a may include the control circuit 11a, a first core block 100a, a second core block 200a, and a target core block 300a.

The first core block 100a shown in FIG. 7A may be similar to the first core block 100 described with reference to FIG. 1, and repeated descriptions thereof may be omitted. The second core block 200a shown in FIG. 7A may be similar to the second core block 200 described with reference to FIG. 1, and repeated descriptions thereof may be omitted. The target core block 300a shown in FIG. 7A may be similar to the target core block 300 described with reference to FIG. 1, and repeated descriptions thereof may be omitted.

The test equipment 20 may provide a test input signal test_in_a to the control circuit 11a. In some implementations, the test input signal test_in_a may include a scan input signal sdi, a scan control signal SE, and a test control signal TE.

The control circuit 11a may test the target core block 300a. For example, the control circuit 11a may control a test operation on the target core block 300a based on the received test input signal test_in_a. The control circuit 11a may provide a target control signal cs_ta to the target core block 300a. The target control signal cs_ta may include a clock signal CLK, the scan control signal SE, and the test control signal TE. The target core block 300a may perform a test operation based on the clock signal CLK, the scan control signal SE, and the test control signal TE.

In some implementations, the target control signal cs_ta may be provided through at least one of a plurality of primary input terminals 370a included in the target core block 300a.

In some implementations, the clock signal CLK may include a first clock signal and a second clock signal. When the scan control signal SE has a first value, the control circuit 11a may provide the first clock signal (for example, a scan shift clock) to the target core block 300a. When the scan control signal SE has a second value, the control circuit 11a may provide the second clock signal (for example, a function clock) to the target core block 300a.

In some implementations, the test control signal TE is a signal for controlling multiplexers included in a primary input multiplexer group 320_1a and multiplexers included in a primary output multiplexer group 320_2a.

In some implementations, test result data on the target core block 300a may be provided as a scan output signal sdo to the control circuit 11a through the second core block 200a.

The control circuit 11a may provide a test output signal test_out_a including the scan output signal sdo to the test equipment 20. A user operating the test equipment 20 may compare a value of the test output signal test_out_a with the test input signal test_in_a to determine whether the target core block 300a is defective.

In some implementations, a test operation on the first core block 100a and the second core block 200a may be performed similarly to a test operation on the target core block 300a. For example, the control circuit 11a may control a test operation on the first core block 100a through a first control signal cs_1a. In addition, for example, the control circuit 11a may control a test operation on the second core block 200a through a second control signal cs_2a.

The integrated circuit 10b shown in FIG. 7B may be similar to the integrated circuit 10a described with reference to FIG. 7A. However, the integrated circuit 10b shown in FIG. 7B is different from the integrated circuit 10a described with reference to FIG. 7A in that scan input data may be provided from the control circuit 10b to each core block, and scan output data may be provided from each core block to the control circuit 11b.

In some implementations, the control circuit 11b may provide a target scan input signal sdi_tb to a target core block 300b. The target core block 300b may provide a scan output signal sdo_tb to the control circuit 11b as a result of a test on the target core block 300b. Likewise, when the control circuit 11b controls a test operation on a first core block 100b, the control circuit 11b may provide a first scan input signal sdi_1b to the first core block 100b. The first core block 100b may provide first scan output data sdo_1b as a result of a test on the first core block 100b to the control circuit 11b. In addition, when the control circuit 11b controls a test operation on the second core block 200b, the control circuit 11b may provide a second scan input signal sdi_2b to the second core block 200b. The second core block 200b may provide second scan output data sdo_2b as a result of a test on the second core block 200b to the control circuit 11b.

The test equipment 20 may provide a test input signal test_in_b to the control circuit 11b. In an embodiment, the test input signal test_in_b may include the target scan input signal sdi_tb, a scan control signal SE, and a test control signal TE.

In some implementations, the test input signal test_in_b may include a first scan input signal sdi_1b, a second scan input signal sdi_2b, a first control signal cs_1b, and a second control signal cs_2b.

The control circuit 11b may provide a test output signal test_out_b including the target scan output signal sdo_tb to the test equipment 20. A user operating the test equipment 20 may compare a value of the test output signal test_out_b with the test input signal test_in_b to determine whether the target core block 300b is defective.

In some implementations, a test operation on the first core block 100b and the second core block 200b may be performed similarly to a test operation on the target core block 300b. For example, the control circuit 11b may control a test operation on the first core block 100b through the first control signal cs_1b. In addition, for example, the control circuit 11b may control a test operation on the second core block 200b through the second control signal cs_2b.

Figure 8:
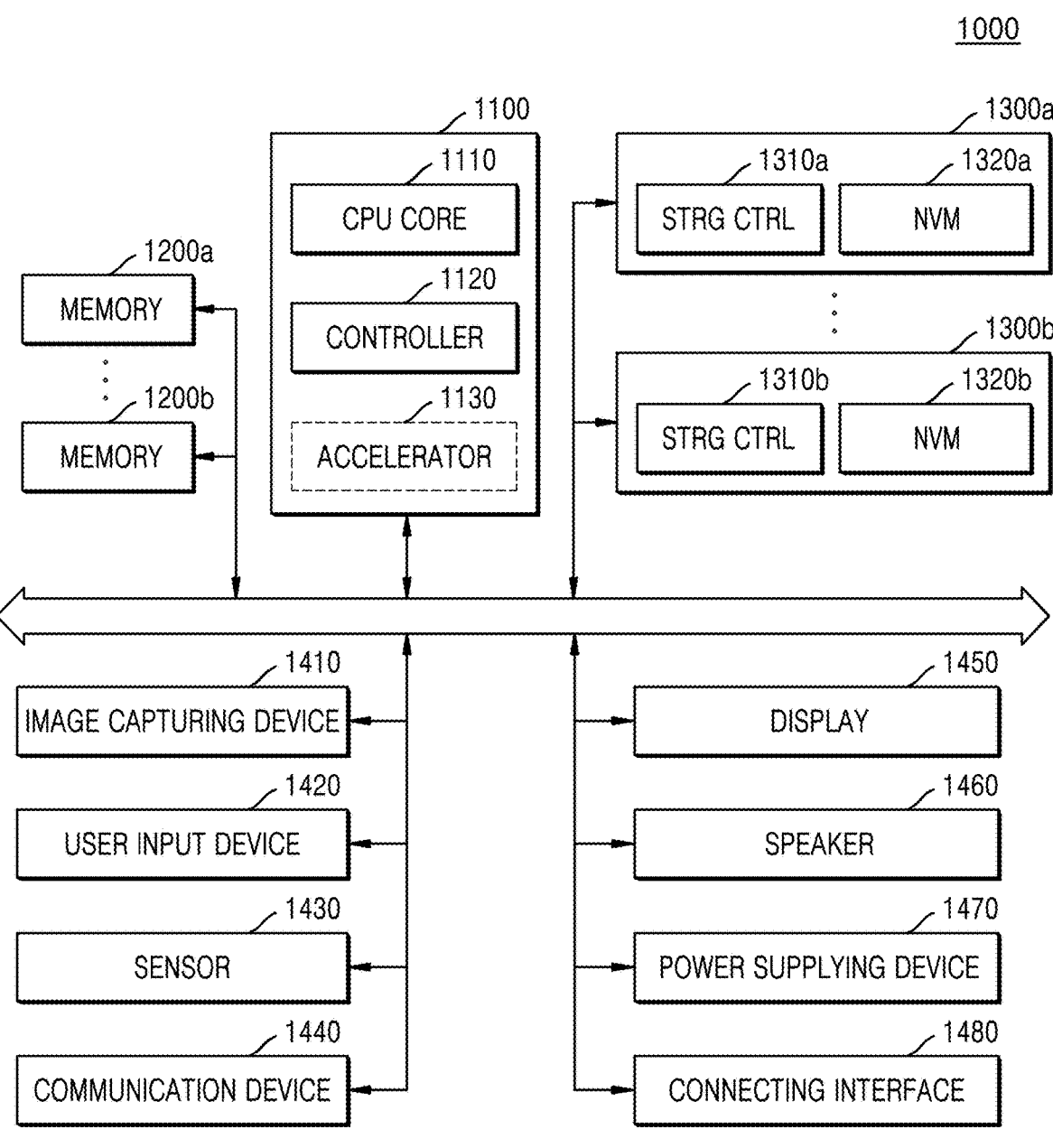
FIG. 8 is a view illustrating an example of a system including an integrated circuit according to some implementations.

FIG. 8 is a view illustrating an example of a system including an integrated circuit according to some implementations. The system 1000 shown in FIG. 8 may basically be a mobile system such as a mobile phone, a smartphone, a tablet personal computer (PC), a wearable device, a health-care device, or an Internet-of-things (IoT) device. However, the system 1000 shown in FIG. 8 is not limited to the mobile system, and may be a PC, a laptop computer, a server, a media player, or an automotive device such as a navigation system.

In FIG. 8, the system 1000 may include a main processor 1100, memories 1200a and 1200b, and storage devices 1300a and 1300b. In addition, the system 1000 may further include at least one selected from the group consisting of an image capturing device 1410, a user input device 1420, a sensor 1430, a communication device 1440, a display 1450, a speaker 1460, a power supplying device 1470, and a connecting interface 1480. For example, the components of the system 1000 shown in FIG. 8, that is, the main processor 1100, the memory 1200a and 1200b, the storage devices 1300a and 1300b, the image capturing device 1410, the user input device 1420, the sensor 1430, the communication device 1440, the display 1450, the speaker 1460, the power supplying device 1470, and the connecting interface 1480, may be embodied using the implementations described above with reference to FIGS. 1 to 7B.

The main processor 1100 may control overall operations of the system 1000. For example, the main processor 1100 may control operations of components of the system 1000. The main processor 1100 may be implemented as a general-purpose processor, a dedicated processor, an application processor, or the like.

The main processor 1100 may include at least one CPU core 1110. The main processor 1100 may further include a controller 1120 configured to control the memories 1200a and 1200b and/or the storage devices 1300a and 1300b. In some implementations, the main processor 1100 may further include an accelerator 1130 as a dedicated circuit for high-speed data operation such as an artificial intelligence (AI) data operation. The accelerator 1130 may include a graphics processing unit (GPU), a neural processing unit (NPU), a data processing unit (DPU), and/or the like. The accelerator 1130 may be implemented as a chip that is physically independent from the other components of the main processor 1100.

The memories 1200a and 1200b may be used as main memory devices of the system 1000. The memories 1200a and 1200b may include volatile memory devices such as SRAM and/or DRAM, or may include NVM devices such as flash memory, PRAM, and/or RRAM. The memories 1200a and 1200b may be provided in a package in which the main processor 1100 is provided.

The storage devices 1300a and 1300b may function as nonvolatile storage devices capable of retaining data without the supply of power, and may have a relatively large storage capacity than the memories 1200a and 1200b. The storage devices 1300a and 1300b may include storage controllers 1310a and 1310b, and NVMs 1320a and 1320b that store data under control by the storage controllers 1310a and 1310b. The NVMs 1320a and 1320b may include 2D and/or 3D VNAND flash memories, or may include other types of NVMs such as PRAM and/or RRAM.

The storage devices 1300a and 1300b may be included in the system 1000 in a state in which the storage devices 1300a and 1300b are physically separate from the main processor 1100 or are provided in the same package as the main processor 1100. In addition, the storage devices 1300a and 1300b may be provided in the form of solid state drives (SSDs) or memory cards attachable to other components of the system 1000 through interfaces such as the connecting interface 1480 (described below). The storage devices 1300a and 1300b may comply with standard protocols such as the UFS, eMMC, or NVMe protocol, but are not limited thereto.

The image capturing device 1410 may capture a still image or a moving picture, and examples of the image capturing device 1410 may include a camera, a camcorder, a webcam, and/or the like.

The user input device 1420 may receive various types of data input from a user of the system 1000, and examples of the user input device 1420 may include a touch pad, a keypad, a keyboard, a mouse, a microphone, and/or the like.

The sensor 1430 may detect various types of physical quantities that may be obtained from the outside of the system 1000 and may convert the detected physical quantities into electrical signals. Examples of the sensor 1430 may include a temperature sensor, a pressure sensor, an illuminance sensor, a position sensor, an acceleration sensor, a biosensor, a gyroscope sensor, and/or the like.

The communication device 1440 may exchange signals with other devices provided outside the system 1000 according to various communication protocols. The communication device 1440 may include an antenna, a transceiver, a modem, and/or the like.

The display 1450 and the speaker 1460 may function as output devices configured to output visual information and audio information to a user of the system 1000.

The power supplying device 1470 may appropriately convert power supplied from a battery included in the system 1000 and/or an external power supply, and may supply the converted power to each component of the system 1000.

The connecting interface 1480 may connect the system 1000 to an external device that is capable of exchanging data with the system 1000 when connected to the system 1000. The connecting interface 1480 may be implemented according to various interface methods, such as advanced technology attachment (ATA), serial ATA (SATA), external SATA (e-SATA), small-computer small-interface (SCSI), serial attached SCSI (SAS), peripheral component interconnect (PCI), PCI express (PCIe), NVMe, IEEE 1394, universal serial bus (USB), secure digital (SD) cards, multi-media card (MMC), eMMC, UFS, embedded UFS (eUFS), and compact flash (CF) card interface.

Figure 9:
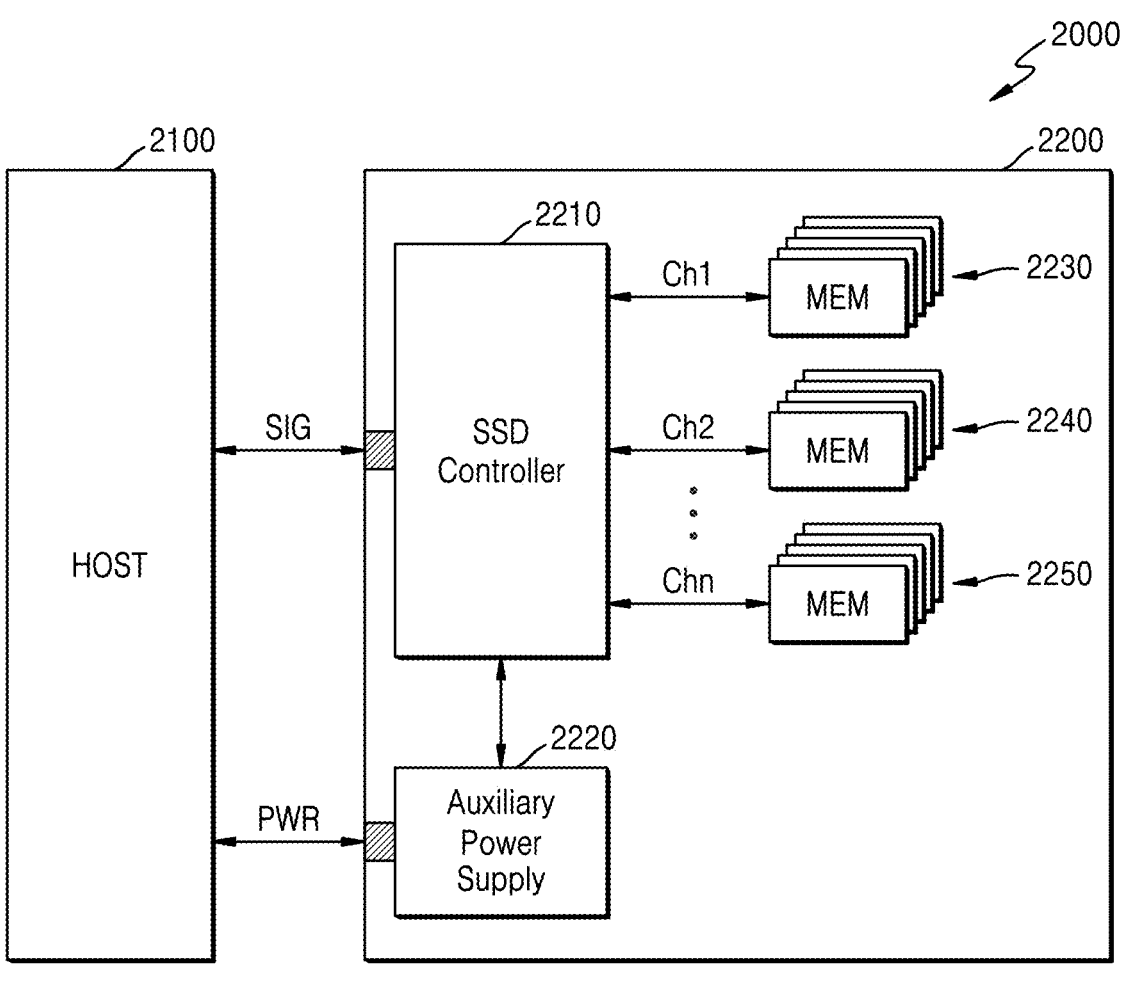
FIG. 9 is a block diagram illustrating an example of applying an integrated circuit to a solid state drive (SSD) system according to some implementations.

FIG. 9 is a block diagram illustrating an example of applying a storage device to an SSD system according to some implementations. In FIG. 9, an SSD system 2000 may include a host 2100 and an SSD 2200. The SSD 2200 may exchange signals with the host 2100 through a signal connector and may receive power through a power connector. The SSD 2200 may include an SSD controller 2210, an auxiliary power supply 2220, and memory devices 2230, 2240, and 2250. The memory devices 2230, 2240, and 2250 may be vertically-stacked NAND flash memory devices. In this case, the SSD controller 2210, the auxiliary power supply 2220, and the memory devices 2230, 2240, and 2250 may be implemented using the implementations described above with reference to FIGS. 1 to 8.

As described above, according to the one or more of the above implementations, a flip-flop included in a scan chain may be reused to test an input to a combinational logic circuit connected to a primary input terminal of a core block. Owing to the reuse of the flip-flop already included in the scan chain, the test coverage of the core block may be increased, and an increase in the area of the core block for testing the combinational logic circuit connected to the primary input terminal may be minimized.

In addition, according to the one or more of the above implementations, the flip-flop included in the scan chain may be reused to test an output of a combinational logic circuit connected to a primary output terminal of the core block. Owing to the reuse of the flip-flop already included in the scan chain, the test coverage of the core block may be increased, and an increase in the area of the core block for testing the combinational logic circuit connected to the primary output terminal may be minimized.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. An integrated circuit comprising:
   a plurality of combinational logic circuits comprising a first combinational logic circuit;
   a plurality of flip-flops comprising a first flip-flop configured to receive a first scan input signal and a first data signal; and
   a first core block comprising a multiplexer, the multiplexer being configured to select, based on a test control signal, at least one of a primary input signal received through a primary input terminal or an output signal of the first flip-flop and provide the selected signal to the first combinational logic circuit,
   wherein the first flip-flop is configured to selectively receive, based on a scan control signal, at least one of the first scan input signal or the first data signal and is configured to selectively perform a scan shift operation based on the first scan input signal or a normal operation based on the first data signal.

2. The integrated circuit of claim 1,
   wherein the plurality of flip-flops further comprise a second flip-flop configured to receive a second scan input signal and a second data signal, and
   wherein the second scan input signal comprises a value stored in the first flip-flop.

3. The integrated circuit of claim 1, wherein the primary input signal is received from a second core block that is different from the first core block.

4. The integrated circuit of claim 1, further comprising a control circuit configured to generate the test control signal and the scan control signal and test the first core block through the test control signal and the scan control signal.

5. The integrated circuit of claim 4,
   wherein the control circuit is configured to, based on the scan control signal having a first value, provide a first clock signal to the first core block,
   wherein the control circuit is configured to, based on the scan control signal having a second value, provide a second clock signal to the first core block, and
   wherein the second clock signal has a higher frequency than the first clock signal.

6. The integrated circuit of claim 1, wherein the first core block is configured to, based on the scan control signal having a first value, cause the plurality of flip-flops to store a value received as a scan input signal.

7. The integrated circuit of claim 1,
   wherein the first core block is configured to, based on the scan control signal having a second value, cause the plurality of flip-flops to store values received from the plurality of combinational logic circuits, and wherein the first core block is configured to, based on the test control signal having a first value, cause the multiplexer to select the output signal of the first flip-flop and cause the first flip-flop to store a value included in the first data signal received from the first combinational logic circuit.

8. An integrated circuit comprising:
a plurality of combinational logic circuits comprising:
    a first combinational logic circuit configured to generate a first output signal, and
    a second combinational logic circuit configured to generate a second output signal and output the second output signal to a primary output terminal;
a plurality of flip-flops comprising a first flip-flop configured to receive a first scan input signal and a first data signal; and
a first core block comprising a multiplexer, the multiplexer being configured to select, based on a test control signal, at least one of the first output signal received from the first combinational logic circuit or the second output signal received from the second combinational logic circuit and provide the selected signal as the first data signal to the first flip-flop,
wherein the first flip-flop is configured to selectively receive, based on a scan control signal, at least one of the first scan input signal or the first data signal.

9. The integrated circuit of claim 8,
wherein the plurality of flip-flops comprise a second flip-flop configured to receive a second scan input signal and a second data signal, and
wherein the first scan input signal comprises a value stored in the second flip-flop.

10. The integrated circuit of claim 8, wherein the second output signal is configured to be provided to a second core block different from the first core block through the primary output terminal.

11. The integrated circuit of claim 8, further comprising a control circuit configured to generate the test control signal and the scan control signal and test the first core block through the test control signal and the scan control signal.

12. The integrated circuit of claim 11,
wherein, the control circuit is configured to, based on the scan control signal having a first value, provide a first clock signal to the first core block,
wherein the control circuit is configured to, based on the scan control signal having a second value, provide a second clock signal to the first core block, and
wherein the second clock signal has a higher frequency than the first clock signal.

13. The integrated circuit of claim 8, wherein the first core block is configured to, based on the scan control signal having a first value, cause the plurality of flip-flops to store a value received as a scan input signal.

14. The integrated circuit of claim 8,
wherein the first core block is configured to, based on the scan control signal having a second value, cause the plurality of flip-flops to store values received from the plurality of combinational logic circuits, and
wherein the first core block is configured to, based on the test control signal having a first value, cause the multiplexer to select the second output signal and cause the first flip-flop to store a value included in the second output signal.

15. An integrated circuit comprising:
a plurality of combinational logic circuits comprising a first combinational logic circuit and a second combinational logic circuit;
a plurality of flip-flops comprising a first flip-flop configured to receive a first scan input signal and a first data signal;
a first multiplexer configured to select, based on a first test control signal, at least one of a first primary input signal received through a first primary input terminal or an output signal of the first flip-flop and output the selected signal as a first selection signal; and
a first core block comprising a second multiplexer, the second multiplexer being configured to receive the first selection signal from the first multiplexer, and select, based on a second test control signal, at least one of a second primary input signal received through a second primary input terminal or the first selection signal, and provide the selected signal as a second selection signal to the first combinational logic circuit,
wherein the first flip-flop is configured to selectively receive, based on a scan control signal, at least one of the first scan input signal or the first data signal.

16. The integrated circuit of claim 15,
wherein the first multiplexer comprises a first inverter configured to provide a first inverted selection signal obtained by inverting the first selection signal to the second multiplexer and the first combinational logic circuit, and
wherein the second multiplexer comprises a second inverter configured to provide a second inverted selection signal obtained by inverting the second selection signal to the second combinational logic circuit.

17. The integrated circuit of claim 15,
wherein the plurality of flip-flops comprise a second flip-flop configured to receive a second scan input signal and a second data signal, and
wherein the second scan input signal comprises a value stored in the first flip-flop.

18. The integrated circuit of claim 15, wherein the first primary input signal and the second primary input signal are configured to be received from a second core block that is different from the first core block.

19. The integrated circuit of claim 15, further comprising a control circuit configured to generate the first test control signal, the second test control signal, and the scan control signal, and test the first core block through the first test control signal, the second test control signal, and the scan control signal.

20. The integrated circuit of claim 19,
wherein the control circuit is configured to, based on the scan control signal having a first value, provide a first clock signal to the first core block,
wherein the control circuit is configured to, based on the scan control signal having a second value, provide a second clock signal to the first core block, and
wherein the second clock signal has a higher frequency than the first clock signal.

* * * * *